(12) United States Patent
Sumita et al.

(10) Patent No.: US 7,475,803 B2
(45) Date of Patent: Jan. 13, 2009

(54) SOLDER BALL LOADING METHOD AND SOLDER BALL LOADING UNIT BACKGROUND OF THE INVENTION

(75) Inventors: Atsunori Sumita, Ibi-gun (JP); Yoichiro Kawamura, Ibi-gun (JP); Shigeki Sawa, Ibi-gun (JP); Katsuhiko Tanno, Ibi-gun (JP); Isao Tsuchiya, Ibi-gun (JP); Yoshiyuki Mabuchi, Ogaki (JP); Osamu Kimura, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/371,083

(22) Filed: Mar. 9, 2006

(65) Prior Publication Data

US 2006/0157540 A1   Jul. 20, 2006

Related U.S. Application Data

(63) Continuation of application No. PCT/JP2005/013504, filed on Jul. 22, 2005.

(30) Foreign Application Priority Data

| Aug. 4, 2004 | (JP) | ............................. 2004-227875 |
| Jun. 29, 2005 | (JP) | ............................. 2005-190496 |
| Jun. 29, 2005 | (JP) | ............................. 2005-190497 |
| Jun. 29, 2005 | (JP) | ............................. 2005-190498 |
| Jun. 29, 2005 | (JP) | ............................. 2005-190499 |

(51) Int. Cl.
*B23K 31/02* (2006.01)
*H01L 21/44* (2006.01)

(52) U.S. Cl. .................... 228/246; 228/180.22; 438/613

(58) Field of Classification Search ............ 228/180.22, 228/245, 246, 41
See application file for complete search history.

(56) References Cited

U.S. PATENT DOCUMENTS

| 5,284,287 | A | * | 2/1994 | Wilson et al. | .......... 228/180.22 |
| 5,445,313 | A | * | 8/1995 | Boyd et al. | .............. 228/248.1 |
| 5,687,901 | A | * | 11/1997 | Hoshiba et al. | ............. 228/246 |
| 6,065,201 | A | * | 5/2000 | Sakai | .......................... 29/430 |
| 6,186,392 | B1 | * | 2/2001 | Ball | ........................... 228/245 |
| 6,268,275 | B1 | * | 7/2001 | Cobbley et al. | ............. 438/612 |
| 6,402,014 | B1 | * | 6/2002 | Inoue et al. | .................. 228/245 |
| 6,541,364 | B2 | * | 4/2003 | Mukuno et al. | ............. 438/612 |
| 6,607,118 | B2 | * | 8/2003 | Cheng et al. | ............. 228/110.1 |

(Continued)

FOREIGN PATENT DOCUMENTS

JP     03-265150     11/1991

(Continued)

*Primary Examiner*—Kiley Stoner
(74) *Attorney, Agent, or Firm*—Oblon, Spivak, McClelland, Maier & Neustadt, P.C.

(57) ABSTRACT

Provides a solder ball loading unit capable of loading fine solder balls on electrodes. Solder balls 78s are gathered by sucking air from a loading cylinder 24 located above a ball arranging mask 16. The gathered solder balls 78s are rolled on the ball arranging mask 16 by moving the loading cylinder 24 in a horizontal direction and the solder balls 78s are dropped onto the electrodes 75 on a multilayer printed wiring board 10 through an openings 16a in the ball arranging mask 16.

9 Claims, 22 Drawing Sheets

U.S. PATENT DOCUMENTS

| | | | |
|---|---|---|---|
| 6,695,200 B2 * | 2/2004 | Suzuki et al. | 228/180.22 |
| 6,766,938 B2 * | 7/2004 | Cheng et al. | 228/41 |
| 6,844,216 B2 * | 1/2005 | Cobbley et al. | 438/106 |
| 6,869,008 B2 * | 3/2005 | Inoue et al. | 228/189 |
| 7,105,432 B2 * | 9/2006 | Cobbley et al. | 438/612 |
| 7,357,295 B2 * | 4/2008 | Shindo et al. | 228/246 |
| 2003/0042287 A1 * | 3/2003 | Inoue | 228/49.5 |
| 2003/0121957 A1 * | 7/2003 | Cobbley et al. | 228/245 |

FOREIGN PATENT DOCUMENTS

| | | |
|---|---|---|
| JP | 2001-244288 | 9/2001 |
| JP | 2001-267731 | 9/2001 |
| JP | 2003-258016 | 9/2003 |
| JP | 2004-193519 | 7/2004 |

* cited by examiner

Fig.1
(A)
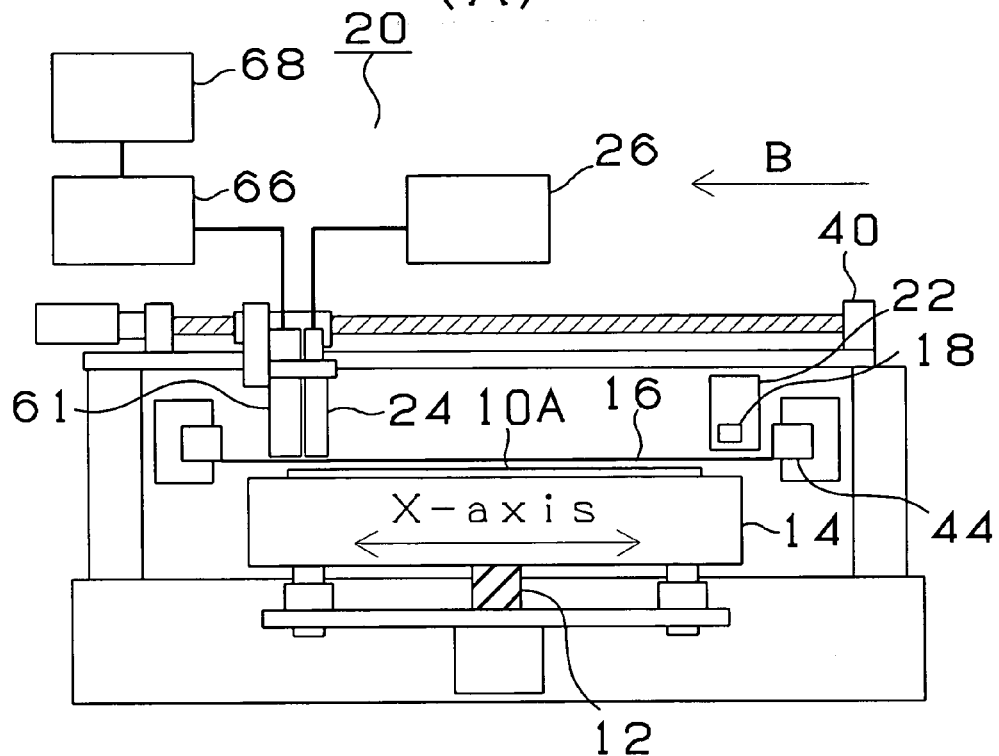
(B)
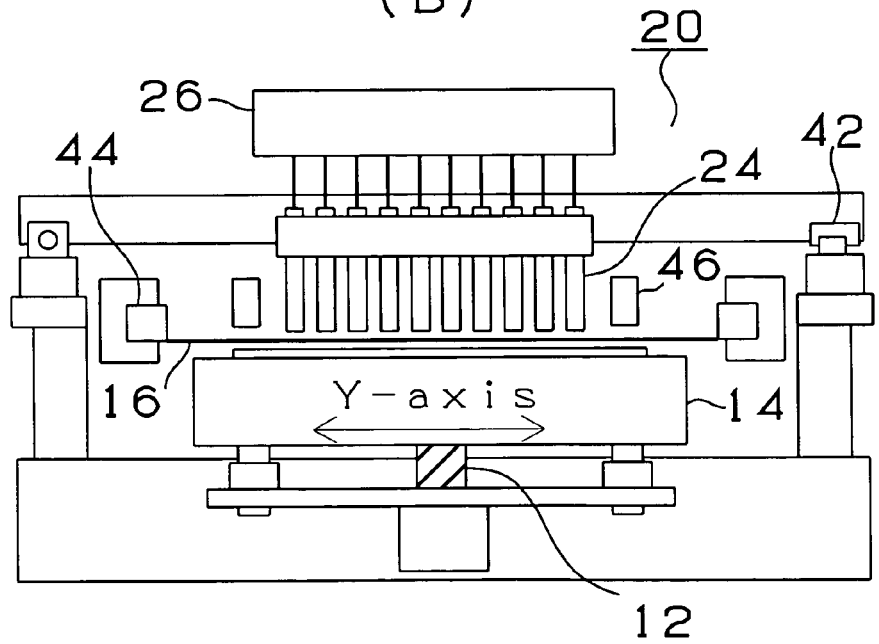

Fig.2
(A)
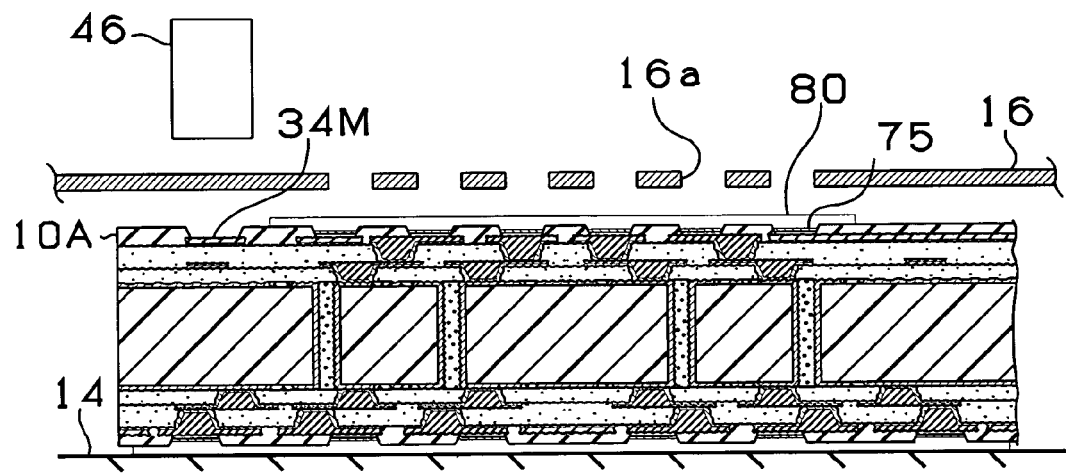
(B)
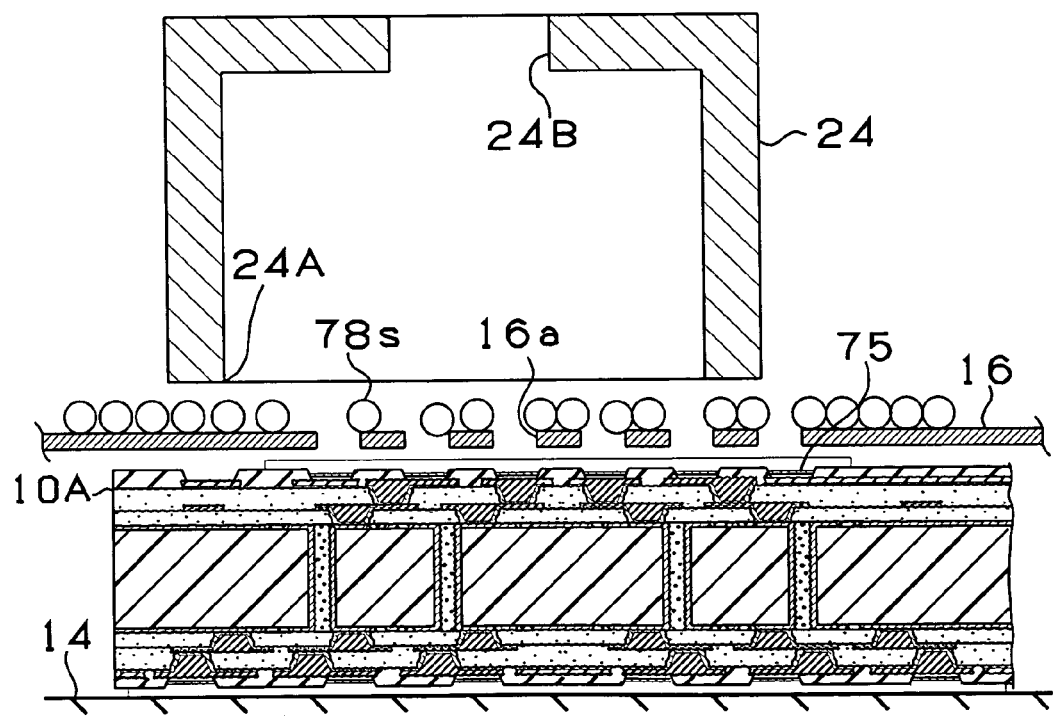

Fig.3
(A)
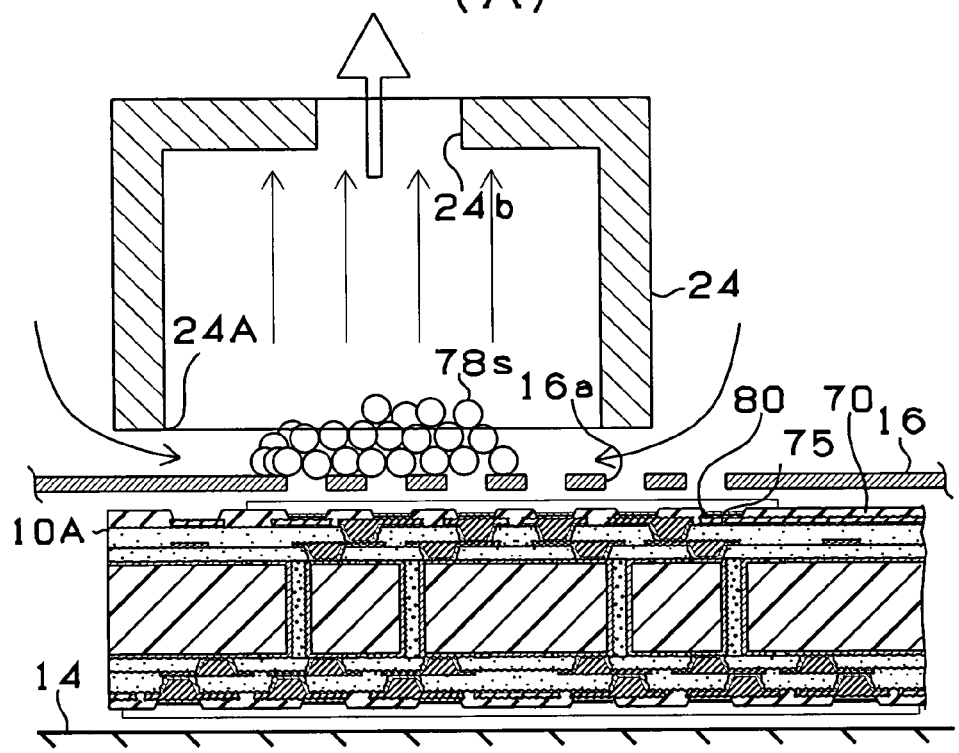
(B)
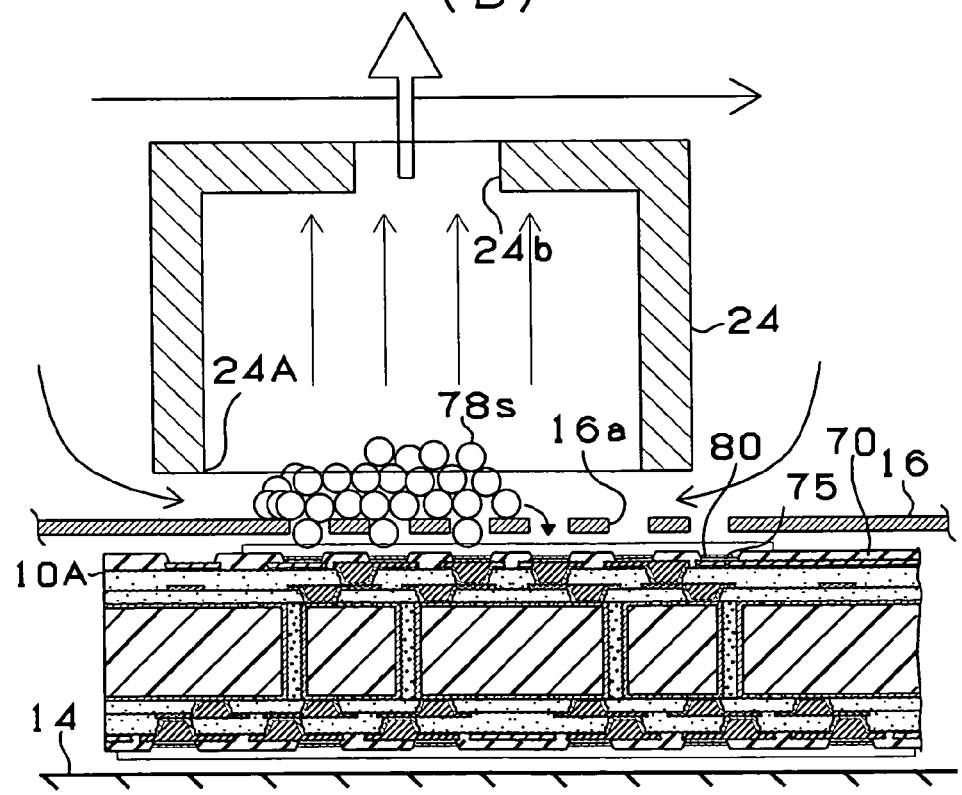

Fig.4
(A)
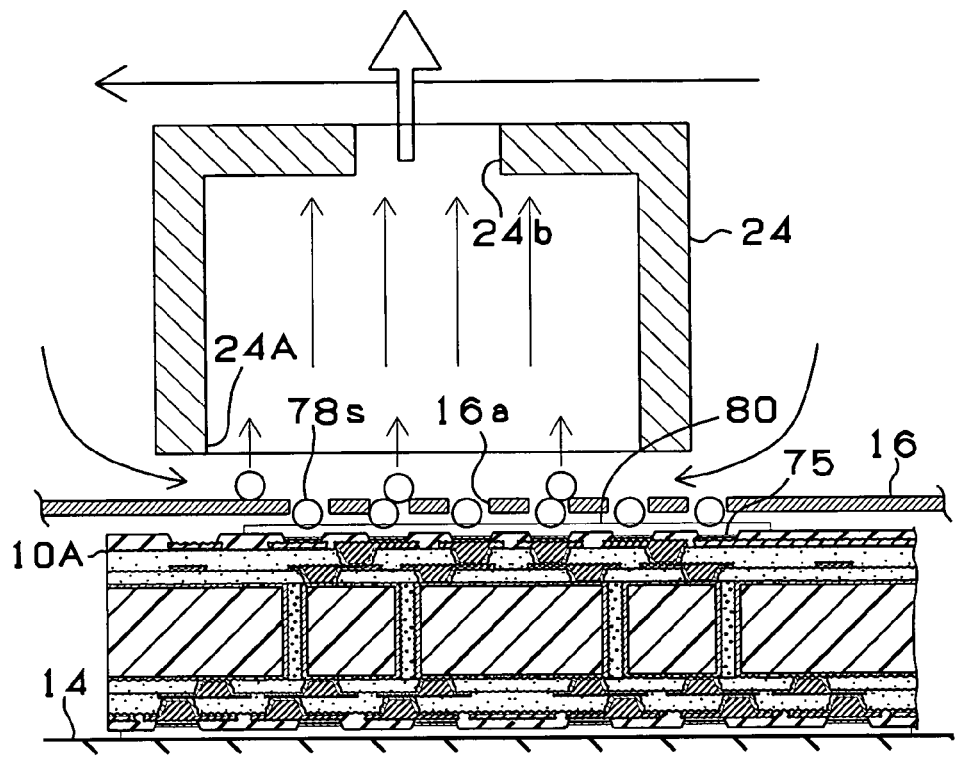
(B)
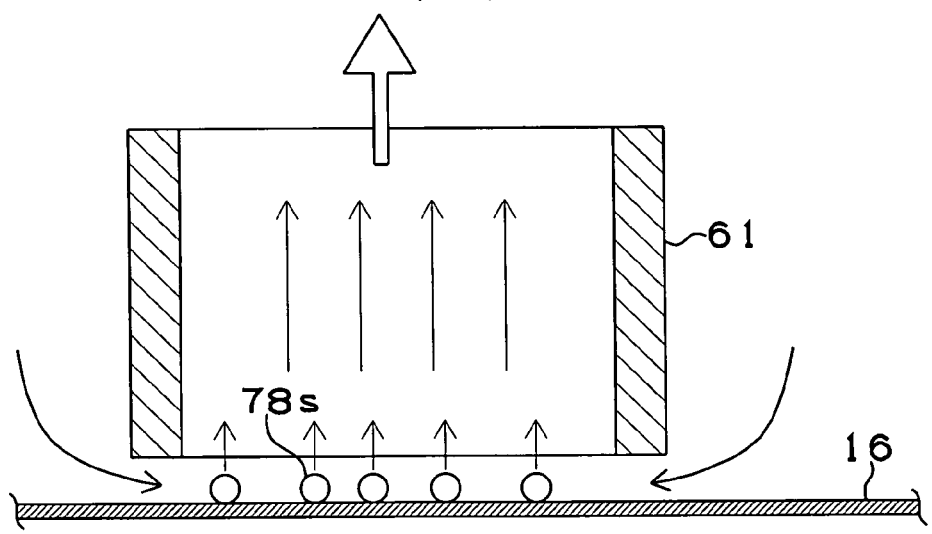

Fig. 9
(A)
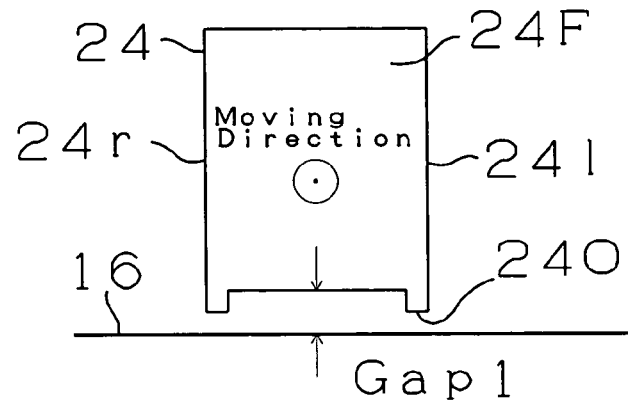
(B)
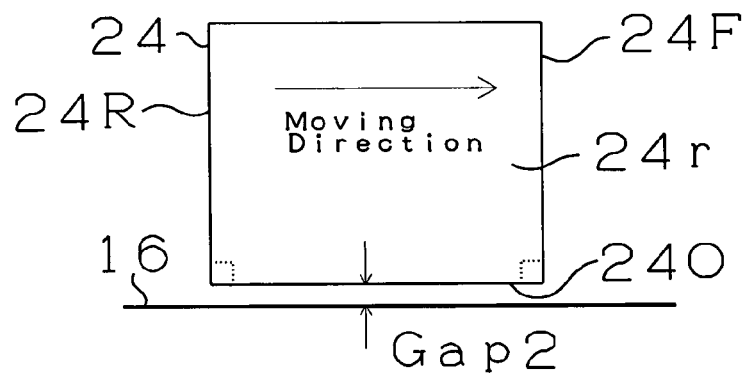
(C)
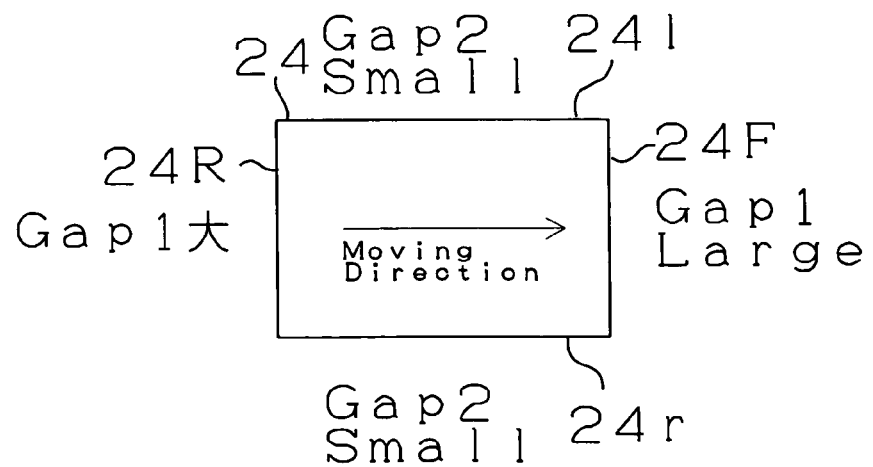

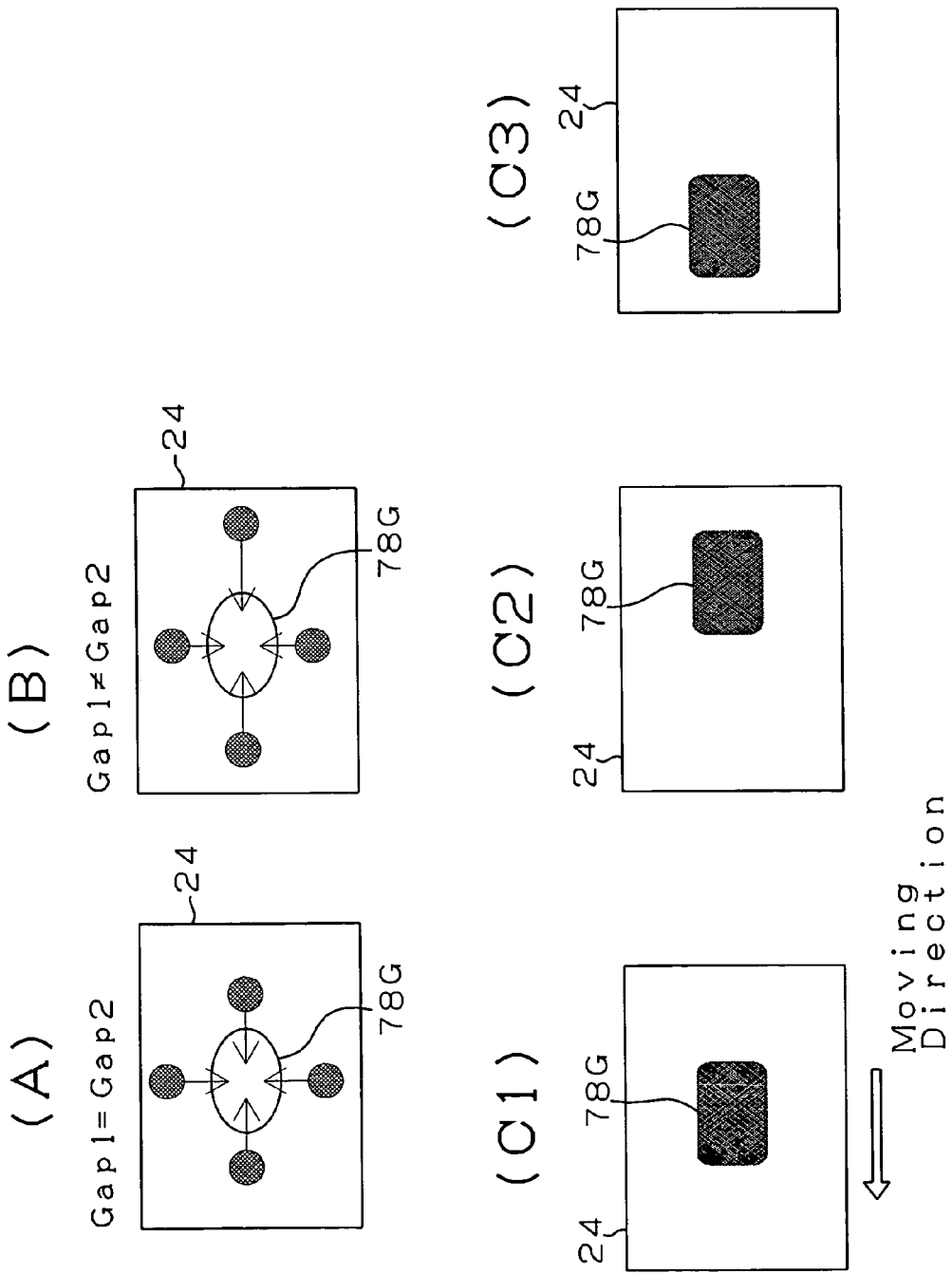

FIG. 11

| Embodiment2 | Gap between loading cylinder and ball loading mask | | | | Gap1 front/ gap 2 right | Yield (%) | Heat cycle test |
|---|---|---|---|---|---|---|---|
| | Gap 1: front (mm) | Gap 1: rear (mm) | Gap 2: right (mm) | Gap 2: left (mm) | | | |
| Embodiment 1−1 | 0.15 | 0.15 | 0.15 | 0.15 | 1 | 90 | △ |
| Embodiment 1−2 | 0.2 | 0.2 | 0.2 | 0.2 | 1 | 88 | △ |
| Embodiment 2−1 | 0.18 | 0.18 | 0.15 | 0.15 | 1.2 | 100 | ○ |
| Embodiment 2−2 | 0.225 | 0.225 | 0.15 | 0.15 | 1.5 | 100 | ○ |
| Embodiment 2−3 | 0.3 | 0.3 | 0.15 | 0.15 | 2 | 100 | ○ |
| Embodiment 2−4 | 0.6 | 0.6 | 0.15 | 0.15 | 4 | 100 | △ |
| Embodiment 2−5 | 0.24 | 0.24 | 0.2 | 0.2 | 1.2 | 100 | ○ |
| Embodiment 2−6 | 0.4 | 0.4 | 0.2 | 0.2 | 2 | 100 | ○ |
| Embodiment 2−7 | 0.75 | 0.75 | 0.25 | 0.25 | 3 | 100 | ○ |
| Embodiment 2−8 | 1.2 | 1.2 | 0.3 | 0.3 | 4 | 100 | △ |
| Embodiment 2−9 | 0.18 | 0.2 | 0.15 | 0.14 | 1.2 | 100 | ○ |
| Embodiment2−10 | 0.4 | 0.45 | 0.2 | 0.15 | 2 | 100 | ○ |
| Embodiment2−11 | 0.06 | 0.06 | 0.04 | 0.04 | 1.5 | 100 | ○ |
| Embodiment 2−12 | 0.1 | 0.1 | 0.08 | 0.08 | 1.25 | 100 | ○ |
| Embodiment 2−13 | 0.08 | 0.08 | 0.1 | 0.1 | 0.8 | 95 | ○ |
| Comparative Example 2 | | | | | | 3 | × |

Fig.12
(A)
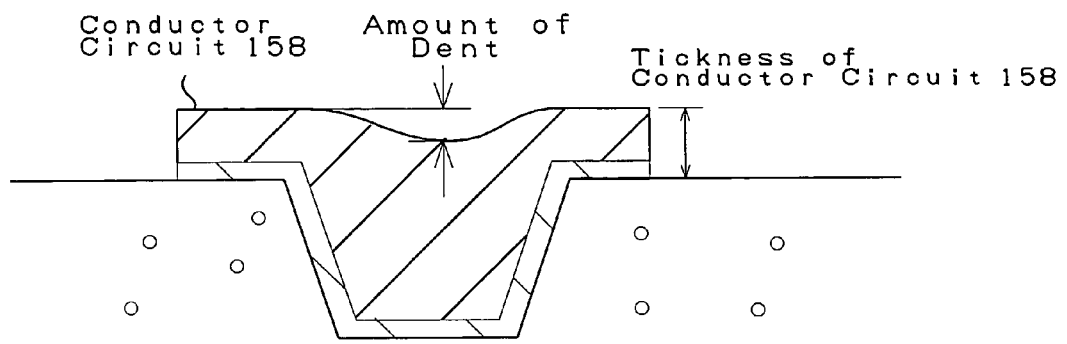
(B)
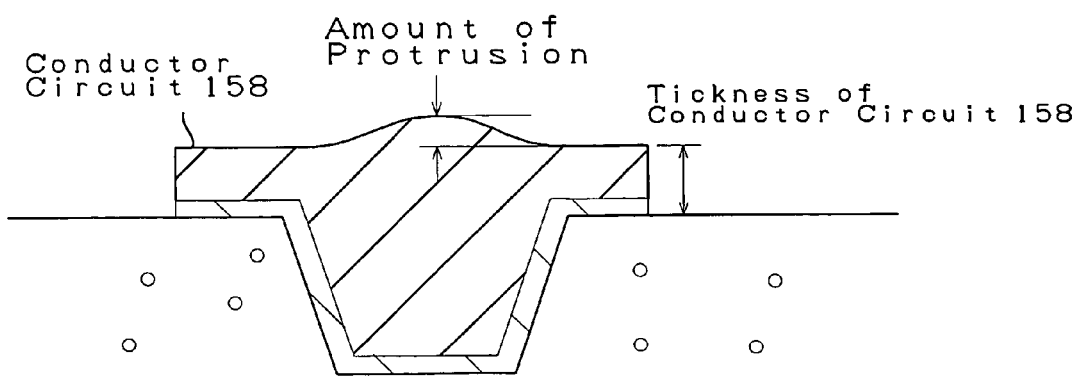

Fig.13
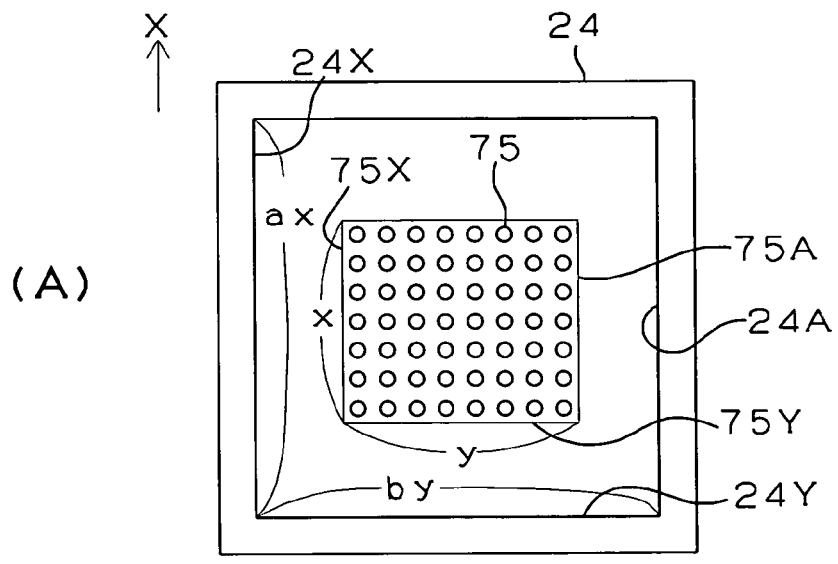
(A)
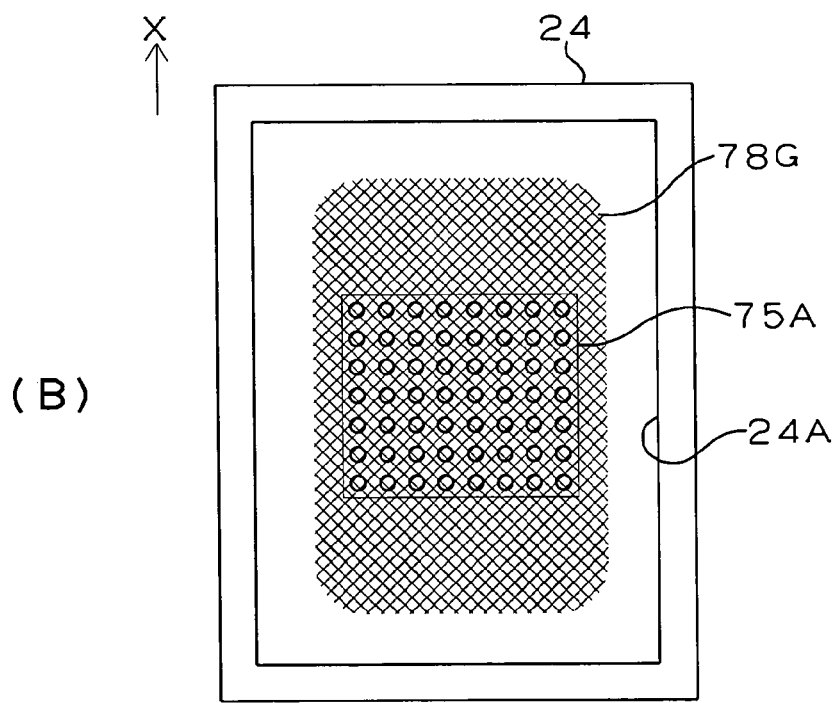
(B)
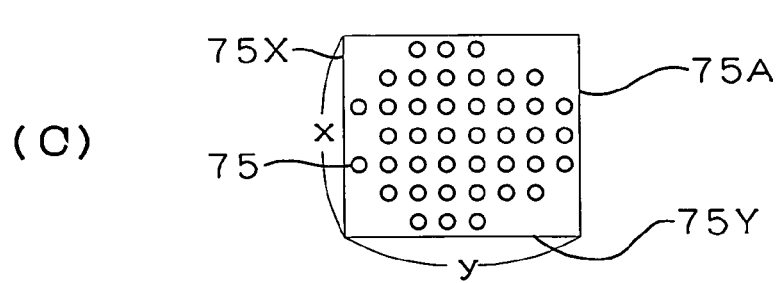
(C)

Fig.14
(A)
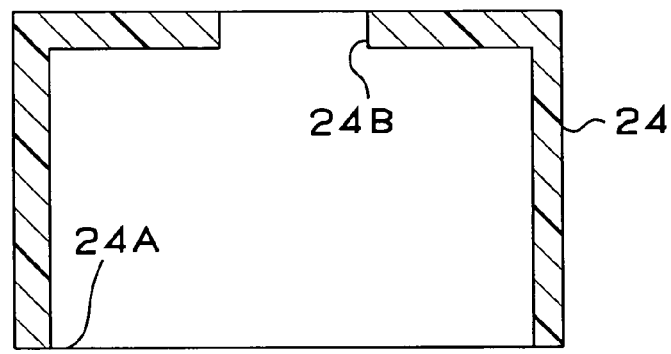
(B)
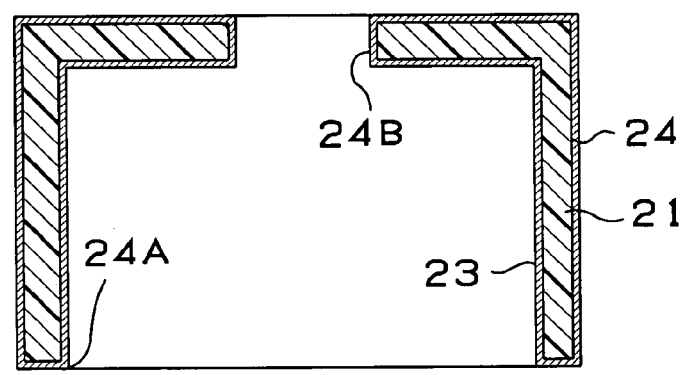
(C)
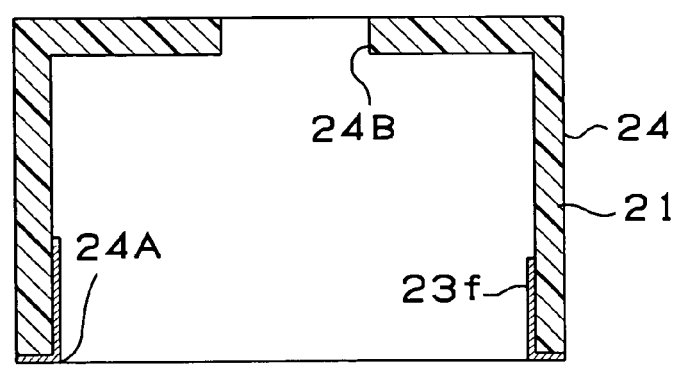

Fig.15
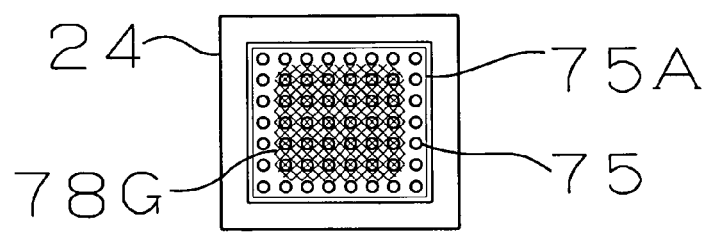
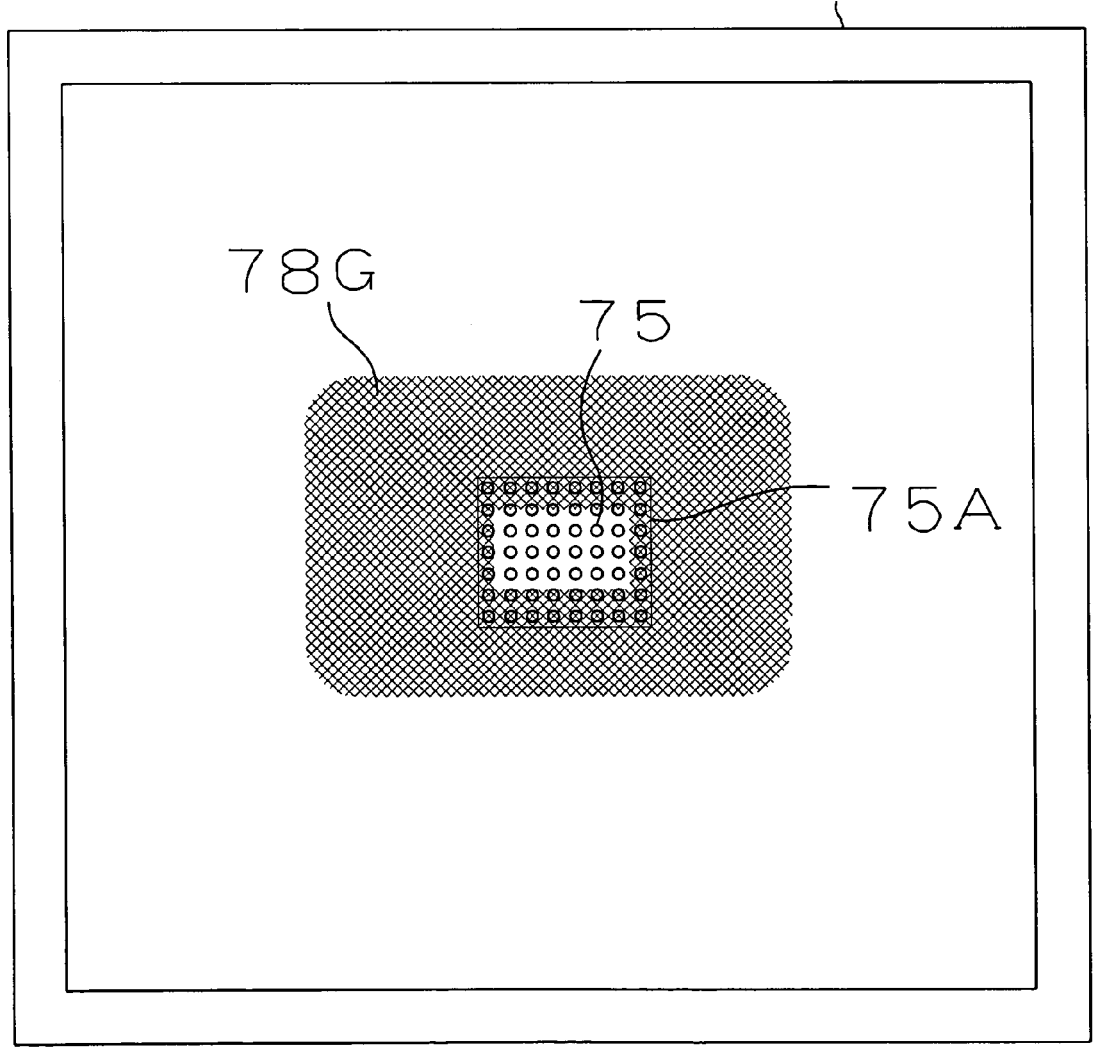

FIG. 16

| # | Diameter of ball ($\mu$m) | a, b of cavity in loading cylinder | | Air flow between loading cylinder and mask (m/sec) | Yield (%) |
| --- | --- | --- | --- | --- | --- |
| | | a | b | | |
| Embodiment4—1 | 80 | 3 | 3 | 11~17 | 90 |
| Embodiment4—2 | 80 | 1.1 | 1.1 | 11~17 | 90 |
| Embodiment4—3 | 80 | 4 | 4 | 11~17 | 90 |
| Embodiment4—4 | 80 | 3 | 1.1 | 5~10 | 100 |
| Embodiment4—5 | 80 | 4 | 1.1 | 20~25 | 100 |
| Embodiment4—6 | 80 | 4 | 3 | 30~35 | 100 |
| Embodiment4—7 | 80 | 2 | 1.1 | 11~17 | 100 |
| Embodiment4—8 | 80 | 3 | 1.1 | 11~17 | 100 |
| Embodiment4—9 | 80 | 4 | 1.1 | 11~17 | 100 |
| Embodiment4—10 | 80 | 4 | 3 | 11~17 | 100 |
| Reference Example4—1 | 80 | 1 | 1 | 11~17 | 20 |
| Reference Example4—2 | 80 | 5 | 5 | 11~17 | 50 |
| Reference Example4—3 | 80 | 3 | 3 | Less than 5 | 20 |
| Reference Example4—4 | 80 | 3 | 3 | 40~45 | 30 |
| Reference Example4—5 | 80 | 1 | 1.1 | 11~17 | 30 |
| Reference Example4—6 | 80 | 5 | 1.1 | 11~17 | 50 |
| Embodiment4—11 | 40 | 3 | 3 | 11~17 | 90 |
| Embodiment4—12 | 40 | 1.1 | 1.1 | 11~17 | 90 |
| Embodiment4—13 | 40 | 4 | 4 | 11~17 | 90 |
| Embodiment4—14 | 40 | 3 | 1.1 | 5~10 | 100 |
| Embodiment4—15 | 40 | 4 | 1.1 | 20~25 | 100 |
| Embodiment4—16 | 40 | 4 | 3 | 30~35 | 100 |
| Embodiment4—17 | 40 | 2 | 1.1 | 11~17 | 100 |
| Embodiment4—18 | 40 | 3 | 1.1 | 11~17 | 100 |
| Embodiment4—19 | 40 | 4 | 1.1 | 11~17 | 100 |
| Embodiment4—20 | 40 | 4 | 3 | 11~17 | 100 |
| Reference Example4—7 | 40 | 1 | 1 | 11~17 | 20 |
| Reference Example4—8 | 40 | 5 | 5 | 11~17 | 50 |
| Reference Example4—9 | 40 | 3 | 3 | Less than 5 | 20 |
| Reference Example4—10 | 40 | 3 | 3 | 40~45 | 30 |
| Reference Example4—11 | 40 | 1 | 1.1 | 11~17 | 30 |
| Reference Example4—12 | 40 | 5 | 1.1 | 11~17 | 50 |

FIG. 17

| # | Diameter of ball (μm) | a, b of cavity in loading cylinder | | Air flow between loading cylinder and mask (m/sec) | Yield (%) |
| --- | --- | --- | --- | --- | --- |
| | | a | b | | |
| Embodiment4-21 | 150 | 3 | 3 | 11~17 | 90 |
| Embodiment4-22 | 150 | 1.1 | 1.1 | 11~17 | 90 |
| Embodiment4-23 | 150 | 4 | 4 | 11~17 | 90 |
| Embodiment4-24 | 150 | 3 | 1.1 | 5~10 | 100 |
| Embodiment4-25 | 150 | 4 | 1.1 | 20~25 | 100 |
| Embodiment4-26 | 150 | 4 | 3 | 30~35 | 100 |
| Embodiment4-27 | 150 | 2 | 1.1 | 11~17 | 100 |
| Embodiment4-28 | 150 | 3 | 1.1 | 11~17 | 100 |
| Embodiment4-29 | 150 | 4 | 1.1 | 11~17 | 100 |
| Embodiment4-30 | 150 | 4 | 3 | 11~17 | 100 |
| Reference Example4-13 | 150 | 1 | 1 | 11~17 | 20 |
| Reference Example4-14 | 150 | 5 | 5 | 11~17 | 50 |
| Reference Example4-15 | 150 | 3 | 3 | Less than 5 | 20 |
| Reference Example4-16 | 150 | 3 | 3 | 40~45 | 30 |
| Reference Example4-17 | 150 | 1 | 1.1 | 11~17 | 30 |
| Reference Example4-18 | 150 | 5 | 1.1 | 11~17 | 50 |
| Embodiment4-31 | 180 | 3 | 3 | 11~17 | 90 |
| Embodiment4-32 | 180 | 1.1 | 1.1 | 11~17 | 90 |
| Embodiment4-33 | 180 | 4 | 4 | 11~17 | 90 |
| Embodiment4-34 | 180 | 3 | 1.1 | 5~10 | 100 |
| Embodiment4-35 | 180 | 4 | 1.1 | 20~25 | 100 |
| Embodiment4-36 | 180 | 4 | 3 | 30~35 | 100 |
| Embodiment4-37 | 180 | 2 | 1.1 | 11~17 | 100 |
| Embodiment4-38 | 180 | 3 | 1.1 | 11~17 | 100 |
| Embodiment4-39 | 180 | 4 | 1.1 | 11~17 | 100 |
| Embodiment4-40 | 180 | 4 | 3 | 11~17 | 100 |
| Reference Example4-19 | 180 | 1 | 1 | 11~17 | 20 |
| Reference Example4-20 | 180 | 5 | 5 | 11~17 | 50 |
| Reference Example4-21 | 180 | 3 | 3 | Less than 5 | 20 |
| Reference Example4-22 | 180 | 3 | 3 | 40~45 | 30 |
| Reference Example4-23 | 180 | 1 | 1.1 | 11~17 | 30 |
| Reference Example4-24 | 180 | 5 | 1.1 | 11~17 | 50 |
| Comparative Example1 | 80 | | | | 3 |
| Comparative Example2 | 40 | | | | 0 |
| Comparative Example3 | 150 | | | | 20 |
| Comparative Example4 | 180 | | | | 60 |

Fig.18
(A)
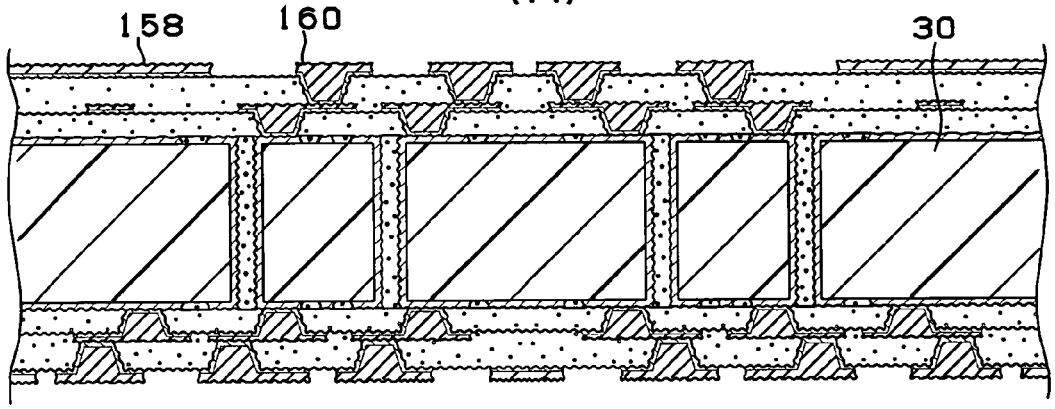
(B)
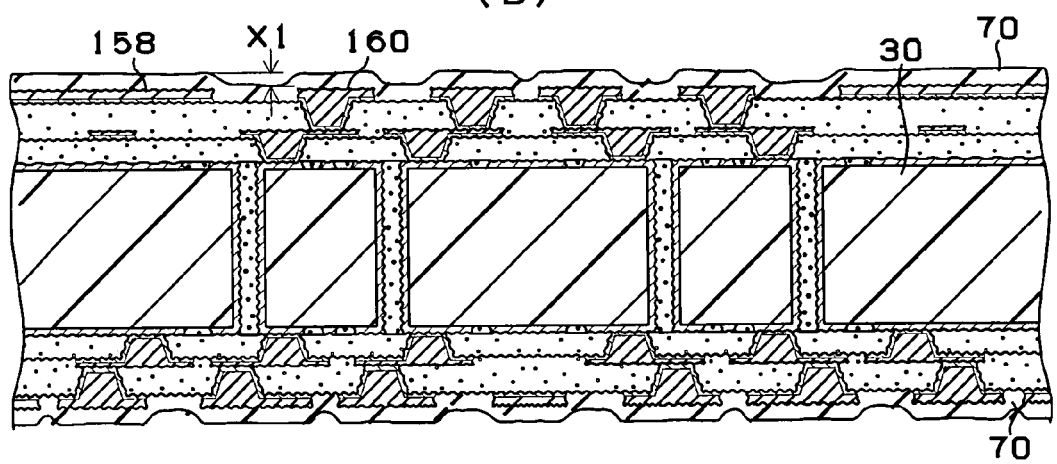
(C)
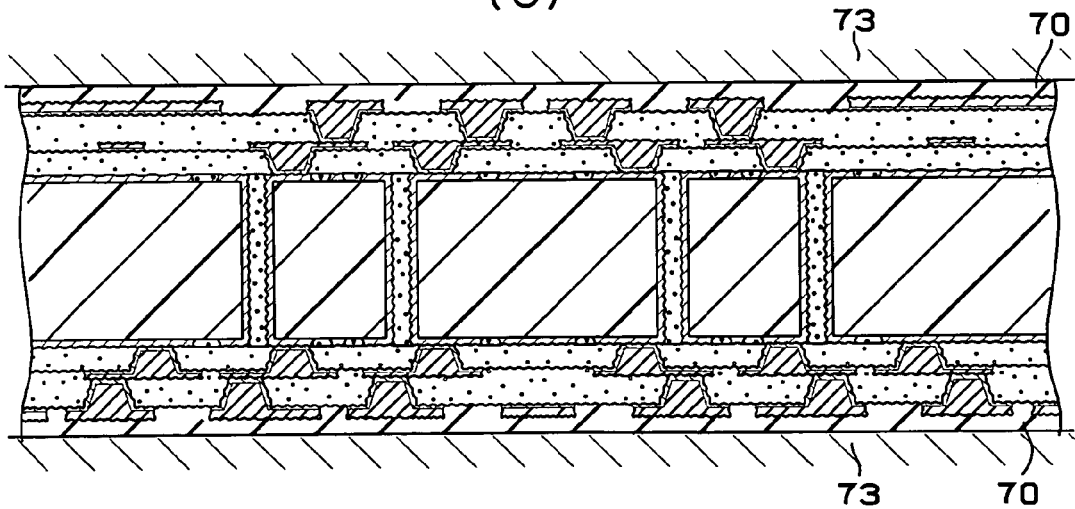

Fig.19
(A)
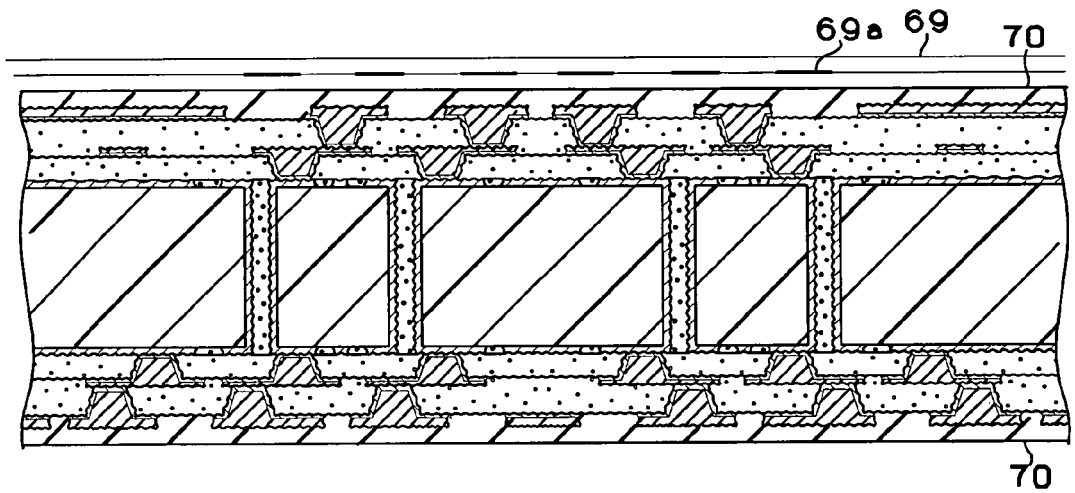
(B)
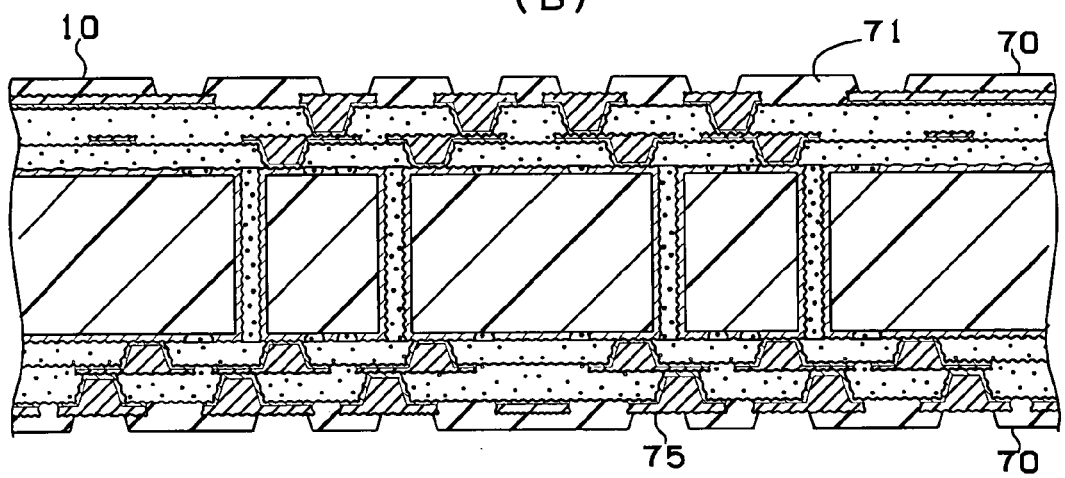
(C)
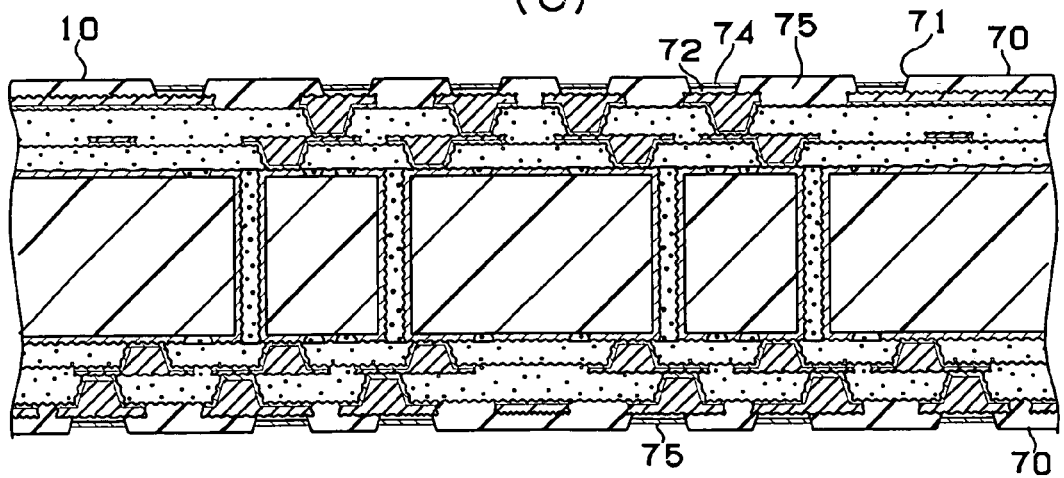

Fig.21
(A)
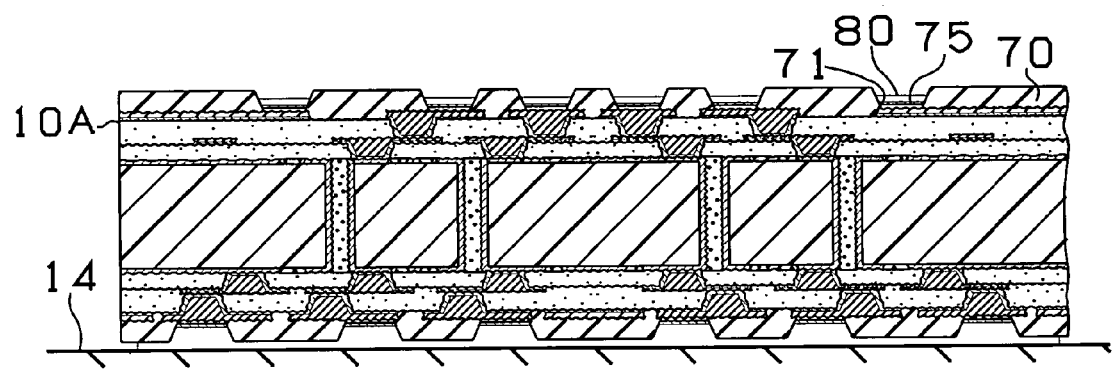
(B)
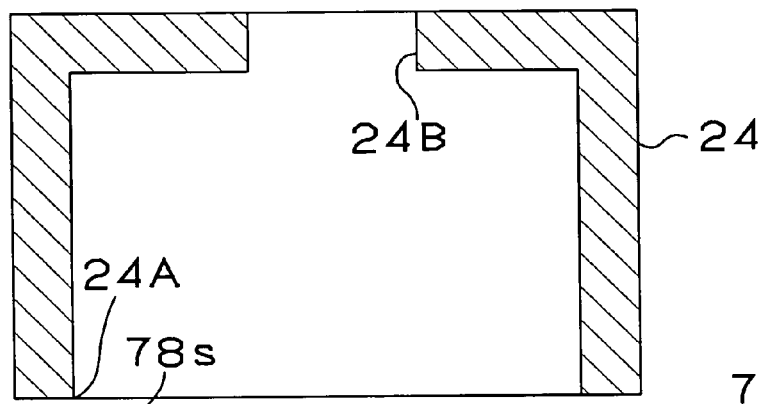
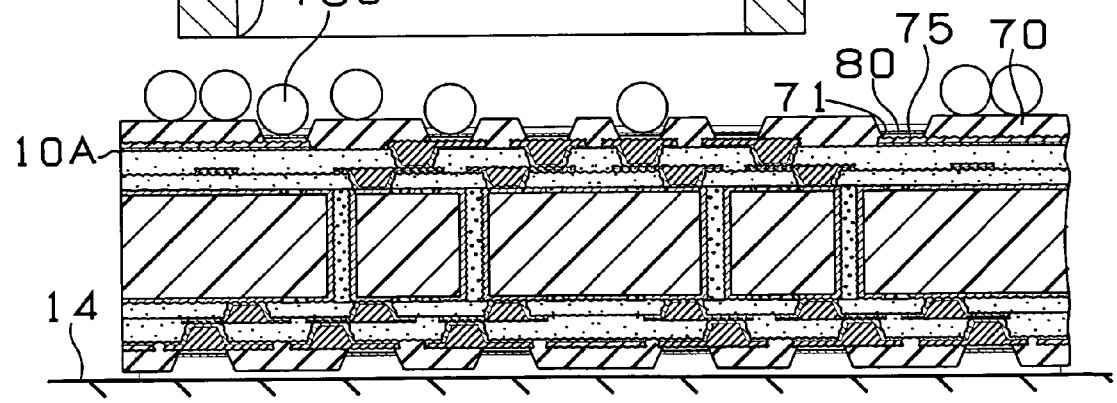

FIG. 22

| Embodiment5 | Flattening condition | | | Connection pad formation condition | | Evaluation result | | | | | | | | | | |
|---|---|---|---|---|---|---|---|---|---|---|---|---|---|---|---|---|
| | Pressure (Mpa) | Time (minute) | Temperature (°C) | Quantity of pads | Size of electronic component loading area (mm2) | Amount of unevenness of SR (μm) | | Abnormal bump | HAST test | | | | Heat cycle test | | |
| | | | | | | min | max | | Time | | | | Frequency | | |
| | | | | | | | | | 50 | 100 | 150 | | 500 | 1000 | 1500 |
| Embodiment5-1 | 5 | 2 | 80 | 2000 | 70 | 0.3 | 0.7 | ○ | ○ | × | × | | ○ | × | × |
| Embodiment5-2 | 5 | 2 | 80 | 4000 | 130 | 0.2 | 0.6 | ○ | ○ | × | × | | ○ | × | × |
| Embodiment5-3 | 5 | 2 | 80 | 10000 | 310 | 0.3 | 0.7 | ○ | ○ | × | × | | ○ | × | × |
| Embodiment5-4 | 5 | 2 | 80 | 30000 | 1200 | 0.3 | 0.7 | ○ | ○ | × | × | | ○ | × | × |
| Embodiment5-5 | 5 | 2 | 60 | 2000 | 70 | 0.8 | 3.1 | ○ | ○ | ○ | ○ | | ○ | ○ | ○ |
| Embodiment5-6 | 5 | 2 | 60 | 4000 | 130 | 0.8 | 3.2 | ○ | ○ | ○ | ○ | | ○ | ○ | ○ |
| Embodiment5-7 | 5 | 2 | 60 | 10000 | 310 | 0.8 | 3 | ○ | ○ | ○ | ○ | | ○ | ○ | ○ |
| Embodiment5-8 | 5 | 2 | 60 | 30000 | 1200 | 0.8 | 3.1 | ○ | ○ | ○ | ○ | | ○ | ○ | ○ |
| Embodiment5-9 | 3 | 2 | 80 | 2000 | 70 | 2 | 5.1 | ○ | ○ | × | × | | ○ | × | × |
| Embodiment5-10 | 3 | 2 | 80 | 4000 | 130 | 2.1 | 5 | ○ | ○ | × | × | | ○ | × | × |
| Embodiment5-11 | 3 | 2 | 80 | 10000 | 310 | 2 | 5.2 | ○ | ○ | × | × | | ○ | × | × |
| Embodiment5-12 | 3 | 2 | 80 | 30000 | 1200 | 2.1 | 5 | ○ | ○ | × | × | | ○ | × | × |
| Embodiment5-13 | 1 | 2 | 80 | 2000 | 70 | 5.1 | 6.5 | ○ | ○ | × | × | | ○ | × | × |
| Embodiment5-14 | 1 | 2 | 80 | 4000 | 130 | 5 | 6.7 | ○ | ○ | × | × | | ○ | × | × |
| Embodiment5-15 | 1 | 2 | 80 | 10000 | 310 | 5.2 | 6.6 | ○ | ○ | × | × | | ○ | × | × |
| Embodiment5-16 | 1 | 2 | 80 | 30000 | 1200 | 5 | 6.5 | ○ | ○ | × | × | | ○ | × | × |
| Embodiment5-17 | 5 | 2 | 80 | 2000 | 70 | 0.3 | 0.7 | ○ | ○ | × | × | | ○ | × | × |
| Comparative Example5-1 | None | None | None | 2000 | 70 | 7 | 8.6 | × | × | × | × | | × | × | × |
| Comparative Example5-2 | None | None | None | 4000 | 130 | 7.1 | 9.2 | × | × | × | × | | × | × | × |
| Comparative Example5-3 | None | None | None | 10000 | 310 | 7 | 7.8 | × | × | × | × | | × | × | × |
| Comparative Example5-4 | None | None | None | 30000 | 1200 | 7.2 | 9.1 | × | × | × | × | | × | × | × |

SOLDER BALL LOADING METHOD AND SOLDER BALL LOADING UNIT BACKGROUND OF THE INVENTION

BACKGROUND OF THE INVENTION

The present invention relates to a solder ball loading method and a solder ball loading unit for loading solder balls, which are to turn to solder bumps, on a printed wiring board.

The solder bumps are used to connect a package substrate with an IC chip. The solder bumps are formed in following process.

(1) Process of printing flux on a connection pad formed on the package substrate
(2) Process of loading the solder ball on the connection pad on which flux is printed
(3) Process of forming the solder bump from the solder ball by reflow.

For example, printing technology described in the patent document 1 is used in the process of loading the aforementioned solder ball on the connection pad. According to this printing technology, a ball arranging mask 116 provided with an opening 116a at each position corresponding to a connection pad 75 is loaded on a printed wiring board 30 and a solder ball 78s is dropped onto the connection pad 75 with a squeegee 124.

Prior art: JP 2001-267731 A is incorporated herein by reference.

SUMMARY OF THE INVENTION

An object of the present invention is to provide a solder ball loading method and a solder ball loading unit capable of loading solder balls of its diameter less than 200 µm on a connection pad securely.

In order to achieve the above object, according to claim 1, a solder ball loading method for loading a solder balls to be turned to a solder bumps on a connection pads of a printed wiring board using a ball arranging mask having a plurality of openings corresponding to the connection pads of the printed wiring board, the solder ball loading method comprising:

locating a cylinder member having an opening portion corresponding to the ball arranging mask above the ball arranging mask and gathering the solder balls on the ball arranging mask just below the cylinder member by sucking air with the cylinder member; and moving the solder balls gathered on the ball arranging mask by moving the cylinder member in a horizontal direction and dropping the solder balls onto the connection pad of the printed wiring board.

According to claim 2, a solder ball loading unit for loading a solder balls to be turned to a solder bumps on a connection pad of a printed wiring board, comprising:

a ball arranging mask having a plurality of openings corresponding to the connection pad of the printed wiring board;

a cylinder member located above the ball arranging mask for gathering the solder balls just below the opening portion by sucking air from the opening portion; and a moving mechanism for moving the cylinder member in the horizontal direction, the moving mechanism moving the solder balls gathered on the ball arranging mask by moving the cylinder member and dropping the solder balls onto the connection pads of the printed wiring board through the opening in the ball arranging mask.

According to claim 3, a solder ball loading unit for loading a solder balls to be turned to a solder bumps on a connection pad of a printed wiring board, comprising:

a ball arranging mask having a plurality of openings corresponding to the connection pad of the printed wiring board;

a cylinder member located above the ball arranging mask for gathering the solder balls just below the opening portion by sucking air from the opening portion; and a moving mechanism for moving the cylinder member in the horizontal direction, the moving mechanism moving the solder balls gathered on the ball arranging mask by moving the cylinder member and dropping the solder balls onto the connection pads of the printed wiring board through the opening in the ball arranging mask, wherein clearance between the bottom end of the opening portion in the cylinder member and the ball arranging mask is made different between in the the back/forth direction and in the right/left direction with respect to the moving direction of the cylinder member.

According to claim 8, a solder ball loading method for loading a solder balls to be turned to a solder bumps on a connection pads of a printed wiring board using a ball arranging mask having a plurality of openings corresponding to the connection pads in the connection pad region of the printed wiring board, wherein the cylinder member having the bottom end of the opening portion whose clearance relative to the ball arranging mask is different between in the back and forth direction and in the right and left direction with respect to the moving direction is located above the ball arranging mask and by sucking air with the cylinder member, the solder balls are gathered on the ball arranging mask just below the cylinder member and then gathered on the ball arranging mask by moving the cylinder member in the horizontal direction and the solder balls are dropped onto the connection pads of the printed wiring board through the openings in the ball arranging mask.

According to claim 9, a solder ball loading unit for loading a solder balls to be turned to a solder bumps on an electrode of a printed wiring board, comprising:

a ball arranging mask having a plurality of openings corresponding to the electrodes of the printed wiring board;

a cylinder member located above the ball arranging mask and for gathering the solder balls just below the opening portions by sucking air from the opening portion; and a moving mechanism for moving the cylinder member in the horizontal direction, the moving mechanism moving the solder balls gathered on the ball arranging mask by moving the cylinder member, dropping the solder balls onto the electrodes of the printed wiring board through the opening in the ball arranging mask, wherein at least the said solder ball contact portion of the cylinder member is constituted of conductive member.

According to claim 13, a solder ball loading method for loading solder balls to be turned to solder bumps on connection pads of a printed wiring board using a ball arranging mask having a plurality of openings corresponding to the connection pads of the printed wiring board, the solder ball loading method comprising:

locating a conductive cylinder member having an opening portion corresponding to the ball arranging mask above the ball arranging mask and gathering the solder balls on the ball arranging mask just below the cylinder member by sucking air with the cylinder member; and moving the solder balls gathered on the ball arranging mask by moving the cylinder member in a horizontal direction and dropping the solder balls onto the connection pad of the printed wiring board through the opening in the ball arranging mask.

According to claim 14, a solder ball loading unit for loading a solder balls to be turned to a solder bumps on each connection pad in a connection pad region of a printed wiring board, comprising:

a ball arranging mask having a plurality of openings corresponding to the connection pad of the printed wiring board;

a cylinder member located above the ball arranging mask for gathering the solder balls just below the opening portion by sucking air from the opening portion; and a moving mechanism for moving the cylinder member in the horizontal direction, the moving mechanism moving the solder balls gathered on the ball arranging mask by moving the cylinder member and dropping the solder balls onto the connection pads of the printed wiring board through the opening in the ball arranging mask, wherein the opening portion in the cylinder member is substantially rectangular, the length of a side parallel to the cylinder member moving direction of the opening portion is set to 1.1 to 4 times the length of a side parallel to the cylinder member moving direction of the connection pad region, and the length of a side perpendicular to the cylinder member moving direction of the opening portion is set to 1.1 to 4 times the length of a side perpendicular to the cylinder member moving direction of the connection pad region.

According to claim 17, a solder ball loading method for loading a solder balls to be turned to a solder bumps on a connection pads of a printed wiring board using a ball arranging mask having a plurality of openings corresponding to a connection pads in a connection pad region of the printed wiring board, wherein the opening portion is substantially rectangular; a cylinder member in which the length of a side parallel to a cylinder member moving direction of the opening portion is set to 1.1 to 4 times the length of a side parallel to the cylinder member moving direction of the connection pad region while the length of a side perpendicular to the cylinder member moving direction of the opening portion is set to 1.1 to 4 times the length of a side perpendicular to the cylinder member moving direction of the connection pad region, is located above the ball arranging mask; solder balls are gathered on the ball arranging mask just below the cylinder member by sucking air with the cylinder member; the solder balls gathered on the ball arranging mask are moved by moving the cylinder member in the horizontal direction and dropped onto the connection pads of the printed wiring board through the opening portions in the ball arranging mask.

According to claim 18, a solder ball loading method for loading a solder balls to be turned to a solder bumps on an electrodes of a printed wiring board using a ball arranging mask having a plurality of openings corresponding to electrodes exposed from openings in a solder resist layer of the printed wiring board, comprising:

flattening the surface of the solder resist layer;

locating a cylinder member having the opening portions above the ball arranging mask and gathering the solder balls on the ball arranging mask just below the cylinder member by sucking air with the cylinder member; and loading the solder balls gathered on the ball arranging mask on the connection pad of the printed wiring board through the openings in the ball arranging mask by moving the cylinder member in the horizontal direction.

According to claim 19, a solder ball loading method for loading a solder balls to be turned to a solder bumps on an electrodes exposed from an openings in a solder resist layer of a printed wiring board, comprising:

flattening the surface of the solder resist layer;

locating a cylinder member having an opening portion above the flattened solder resist layer and gathering the solder balls on the solder resist layer just below the cylinder member by sucking air with the cylinder member; and loading the solder balls gathered on the solder resist layer on the connection pad of the printed wiring board by moving the cylinder member in the horizontal direction.

According to the solder ball loading method of claim 1, the solder ball loading unit of claim 2 and the solder ball loading method of claim 8, the cylinder member is located above the ball arranging mask and the solder balls are gathered by sucking air through an opening portion in the cylinder member and then, the gathered solder balls are moved on the ball arranging mask by moving the cylinder member in the horizontal direction and dropped onto the connection pad of the printed wiring board through the openings in the ball arranging mask. Consequently, fine solder balls can be loaded on all the connection pads of the printed wiring board securely. Further, because the solder balls are moved without any contact, the solder balls can be loaded on the connection pads without being damaged different from a method of using a squeegee, so that the heights of the solder bumps can be equalized. Further, the solder balls can be loaded on the connection pads appropriately of even a printed wiring board having much unevenness on its surface like a built-up multilayer wiring board. Further because solder balls are not likely to coagulate due to the non-contact, a single solder ball can be loaded on the connection pad securely.

According to the solder ball loading unit of claim 3 and the solder ball loading method of claim 8, the clearance between the opening portion at the bottom end of the cylinder member and the ball arranging mask is different between in the back and forth direction and in the right and left direction with respect to the moving direction of the cylinder member. Consequently, forces applied to the solder ball from four directions (back and forth, right and left) by air flow going in through the clearance become unequal. Thus, the frequency of collision of the solder balls with each other drops in the cylinder member in which they are gathered by air flow, so that the solder balls become easy to drop into the opening in the ball arranging mask. Additionally, missing of the solder ball decreases so that the volume of the solder bump is likely to stabilize.

In the solder ball loading unit of claim 4, because as for the clearance between the opening portion at the bottom end of the cylinder member and the ball arranging mask, the clearance in the back and forth direction with respect to the advancing direction of the cylinder member is larger than the clearance in the right and left direction, the solder balls can be moved back and forth with respect to the moving direction with a moving of the cylinder member. Although the solder balls are moved with the moving of the cylinder member, if the cylinder member changes from a stationary state to a moving state, first, the solder balls are moved backward with respect to a central position of the cylinder member and after a relative position is changed once, moved forward across the central position by air flow from the backward. After that, they are moved backward by air flow from forward. That is, with a moving of the cylinder member, the solder balls are moved back and forth with respect to the advancing direction from the central position of the cylinder member, so that they become easy to drop into the openings in the ball arranging mask.

Because in the solder ball loading unit of claim 5, the opening portion of the cylinder member is substantially rectangular, the solder balls can be loaded effectively on the connection pads within a substantially rectangular connection pad region by gathering the solder balls into a rectangular shape.

Because in the solder ball loading unit of claim 6, a plurality of the cylinder members are arranged corresponding to the width of the printed wiring board, the solder balls can be loaded on all the connection pads of the printed wiring board securely only by feeding the plurality of cylinder members in a vertical direction with respect to the direction of its column. The connection pad region mentioned here refers to the region 75A in FIG. 8 and a rectangular region which contains connection pads located on the outermost periphery while its area is minimized. In the meantime, x, y in case where a connection pads 75 are not disposed in a rectangular shape as shown in FIG. 13(C) are set so that the connection pads on the outermost periphery are contained and the rectangular area of the connection pad region 75A is minimized.

Because the solder ball loading unit of claim 7 is capable of collecting the solder balls left on the ball arranging mask with a suction pipe, no excess solder balls are left to lead to a cause for trouble or the like.

According to the solder ball loading unit of claim 9, with the cylinder member located above the ball arranging mask, the solder balls are gathered by sucking air from the opening portion in the cylinder member and the gathered solder balls are moved on the ball arranging mask by moving the cylinder member in the horizontal direction. Then, the solder balls are dropped on the connection pads of the printed wiring board through the openings in the ball arranging mask. Consequently, fine solder balls can be loaded on all the connection pads of the printed wiring board securely. Further, because the solder balls are moved without any contact, the solder balls can be loaded on the connection pads without being damaged different from a case of using a squeegee and the heights of the solder bumps can be equalized. Further, the solder balls can be loaded on the connection pads appropriately of even a printed wiring board having much unevenness on its surface like a built up multiplayer wiring board.

Even if when the solder balls are carried on the ball arranging mask, the solder balls are charged by mutual collision, the solder balls having a small diameter and light weight can be loaded on the printed wiring board securely without adhering to the cylinder member due to electrostatic, because at least a solder ball contact portion of the cylinder member is constituted of conductive member.

Because according to claim 10, the cylinder member is constituted of conductive metal, even if the solder balls having a small diameter and light weight, charged, the solder balls do not adhere to the cylinder member due to electrostatic and therefore, the solder balls can be loaded on the printed wiring board securely.

Because according to claim 11, the cylinder member is constituted of conductive plastic member, even if the solder balls having a small diameter and light weight are charged, the solder balls do not adhere to the cylinder member due to electrostatic and therefore, the solder balls can be loaded on the printed wiring board securely.

Because according to claim 12, the cylinder member is constituted by disposing metallic film on the surface of resin, even if the solder balls having a small diameter and light weight are charged, do not adhere to the cylinder member due to electrostatic and therefore, the solder balls can be loaded on the printed wiring board securely.

According to claim 13, even if when the solder balls are carried on the ball arranging mask, the solder balls are charged due to mutual collision, the solder balls having a small diameter and light weight do not adhere to the cylinder member due to electrostatic because the cylinder member is conductive, so that the solder balls can be loaded on the printed wiring board securely.

According to the solder ball loading unit of claim 14 and the solder ball loading method of claim 17, with the cylinder member located above the ball arranging mask, the solder balls are gathered by sucking air from the opening portion in the cylinder member and the gathered solder balls are moved on the ball arranging mask by moving the cylinder member in the horizontal direction and dropped onto the connection pads of the printed wiring board through the openings in the ball arranging mask. Consequently, the fine solder balls can be loaded on all the connection pads of the printed wiring board securely. Furhter, because the solder balls are carried without any contact, the solder balls can be loaded on the connection pads without being damaged different from a case of using the squeegee, so that the heights of the solder bumps can be equalized. Further, even in case of a printed wiring board having much unevenness on its surface, the solder balls can be loaded appropriately on the connection pads like a built-up multilayer wiring board. Additionally, because the solder balls are not likely to coagulate due to the non-contact, a single solder ball can be loaded on the connection pad securely.

Because the opening portion in the cylinder member is formed in a substantially rectangular shape, the solder balls can be loaded effectively on the connection pads within such a substantially rectangular connection pad region by gathering the solder balls into the substantially rectangular shape. Here, because the length of the side parallel to the cylinder member moving direction of the opening portion of the cylinder member is set to 1.1 to 4 times the length of the side parallel to the cylinder member moving direction of the connection pad region while the length of the side perpendicular to the cylinder member moving direction of the opening portion is set to 1.1 to 4 times the length of the side perpendicular to the cylinder member moving direction of the connection pad region, the solder balls can be gathered in the connection pad region of the printed wiring board. If that value is less than 1.1 times, the solder balls cannot be loaded on the connection pads on the outer periphery of the connection pad region. If it exceeds 4 times, the solder balls are not gathered in the center of the cylinder member and consequently, the solder balls cannot be loaded on the connection pads in the center of the connection pad region.

According to the solder ball loading unit of claim 15, (length of the side parallel to the cylinder member moving direction of the opening portion)/(length of the side parallel to the cylinder member moving direction of the connection pad region) is set larger than (length of the side perpendicular to the cylinder member moving direction of the opening portion)/(length of the side perpendicular to the cylinder member moving direction of the connection pad region). As a result, the solder balls can be gathered long in the cylinder member moving direction with respect to the substantially rectangular connection pad region, so that the solder balls can be loaded on the connection pads effectively within the substantially rectangular connection pad region.

According to the solder ball loading unit of claim 16, because air speed between the cylinder member and the ball arranging mask is set to 5 to 35 m/sec, the solder balls can be loaded effectively on the connection pad by gathering the solder balls on the connection pad region appropriately. If the air speed is less than 5 m/sec, the solder balls concentrate on the outer periphery of the cylinder member, so that the solder balls cannot be loaded on the connection pad region located in the center of the connection pad region easily. On the other hand, if the air speed exceeds 35 m/sec, the solder balls concentrate on the central portion of the cylinder member, so that the solder balls cannot be loaded easily on the connection pad region located on the outer peripheral portion of the connection pad. The connection pad region mentioned here refers to a region 75A in FIG. 8 and a rectangular area containing the connection pads located in the outermost layer and whose area is minimized. Unless the connection pads 75 are disposed in the rectangular shape as shown in FIG. 13(C), the connection pad region is so set that the connection pads on the outermost periphery are contained and the rectangular area of the connection pad region 75A is minimized.

According to the solder ball loading unit of claim 18, with the cylinder member located above the ball arranging mask, the solder balls are gathered by sucking air from the opening portion in the cylinder member and the gathered solder balls are moved on the ball arranging mask by feeding the cylinder member in the horizontal direction. Then the solder balls are dropped onto the connection pads of the printed wiring board through the openings in the ball arranging mask. Thus, the fine solder balls can be loaded on all the connection pads of the printed wiring board securely. Further, the solder balls can be loaded on the connection pads without being damaged different from a case of using the squeegee, because the solder balls are moved without any contact and the heights of the solder bumps can be equalized. Additionally, because the solder balls are not likely to coagulate due to the non-contact, a single solder ball can be loaded on the connection pad securely.

Because even in case of a printed wiring board having much unevenness on its surface like a built-up multilayer wiring board, the surface of the semi-hardened or dried solder resist layer is flattened by pressing it with a flattening member, the surface of the ball arranging mask on the printed wiring board is also flattened, so that the solder balls can be moved on the ball arranging mask easily. Thus, a single solder ball can be loaded on the connection pad.

According to claim 19, the surface of the semi-hardened or dried solder resist layer is flattened by pressing it with a flattening member and the cylinder member is located above the flattened solder resist layer. By sucking air from the opening portion in the cylinder member, the solder balls are gathered and by feeding the cylinder member in the horizontal direction, the solder balls are moved on the printed wiring board and consequently, a single solder ball can be loaded on the connection pad. Because no ball arranging mask is used, even if the opening in the solder resist layer on the side of the printed wiring board is fine, positional deflection between the ball arranging mask and the opening can be eliminated.

BRIEF DESCRIPTION OF THE DRAWINGS

FIG. 1 (A) is a structure diagram showing the structure of a solder ball loading unit according to an embodiment of the present invention and FIG. 1(B) is a drawing taken as seen from an arrow B of the solder ball loading unit of FIG. 1(A);

FIG. 2(A) is an explanatory diagram for positioning the multilayer printed wiring board and FIG. 2(B) is an explanatory diagram of supply of the solder balls to a loading cylinder;

FIG. 3(A) is an explanatory diagram of assembly of the solder balls in the loading cylinder and FIG. 3(B) is an explanatory diagram of assembly and introduction of the solder balls by the loading cylinder;

FIG. 4(A) is an explanatory diagram about drop of the solder balls onto the connection pad and FIG. B(B) is an explanatory diagram for removal of the solder balls by a suction ball removing cylinder;

FIG. 9(A), FIG. 9(B), FIG. 9(C) are explanatory diagrams about a clearance between the loading cylinder and the arranging mask of the example 2;

FIG. 10(A) is a schematic diagram for explaining the motion of a solder ball when the clearances of the loading cylinder are equal in the back and forth direction and the right and left direction, FIG. 10(B) is a schematic diagram for explaining the motion of the solder ball when the clearances of the loading cylinder of the example 2 are different in the back and forth direction and the right and left direction, and FIG. 10(C1) to (C3) are schematic diagrams for explaining the motion of the solder ball when it is larger than the clearances in the back and forth direction and the right and left direction of the loading cylinder;

FIG. 11 is a Table showing an evaluation result of the example 2 and the comparative example 2;

FIG. 12 is an explanatory diagram about the amount of unevenness of a filled via hole;

FIG. 13(A) is an explanatory diagram showing a correspondence between a connection pad region and the loading cylinder of the example 3 and the example 4, FIG. 13(B) is an explanatory diagram of solder ball group assembled by the loading cylinder and FIG. 13(C) is a plan view of another example of the connection pad region;

FIG. 14(A) is a sectional view of a loading cylinder of an example 3-2, FIG. 14(B) is a sectional view of a loading cylinder of an example 3-3 and FIG. 14(C) is a sectional view of a loading cylinder of an example 3-4;

FIG. 15(A) is an explanatory diagram showing a correspondence between a loading cylinder in which a, b in the example 4 are less than 1.1 and a solder ball group and FIG. 15(B) is an explanatory diagram showing a correspondence between a loading cylinder in which a, b are over 4 and a solder ball group;

FIG. 16 is a Table showing an evaluation result on the example 4, reference example 4 and comparative example 4;

FIG. 17 is a Table showing an evaluation result on the example 4, reference example 4 and comparative example 4;

FIGS. 18(A), 18(B), 18(C) are explanatory diagrams of manufacturing process of multilayer printed wiring board according to the example 5;

FIGS. 19(A), 19(B), 19(C) are explanatory diagrams of manufacturing process of multilayer printed wiring board according to the example 5;

FIG. 21(A) is a sectional view of a printed wiring board according to the example 5-1 and FIG. 21(B) is an explanatory diagram of loading solder balls on the printed wiring board;

FIG. 22 is a Table showing an evaluation result on the example 5 and comparative example 5.

BEST MODE FOR CARRYING OUT THE INVENTION

Figure 6:
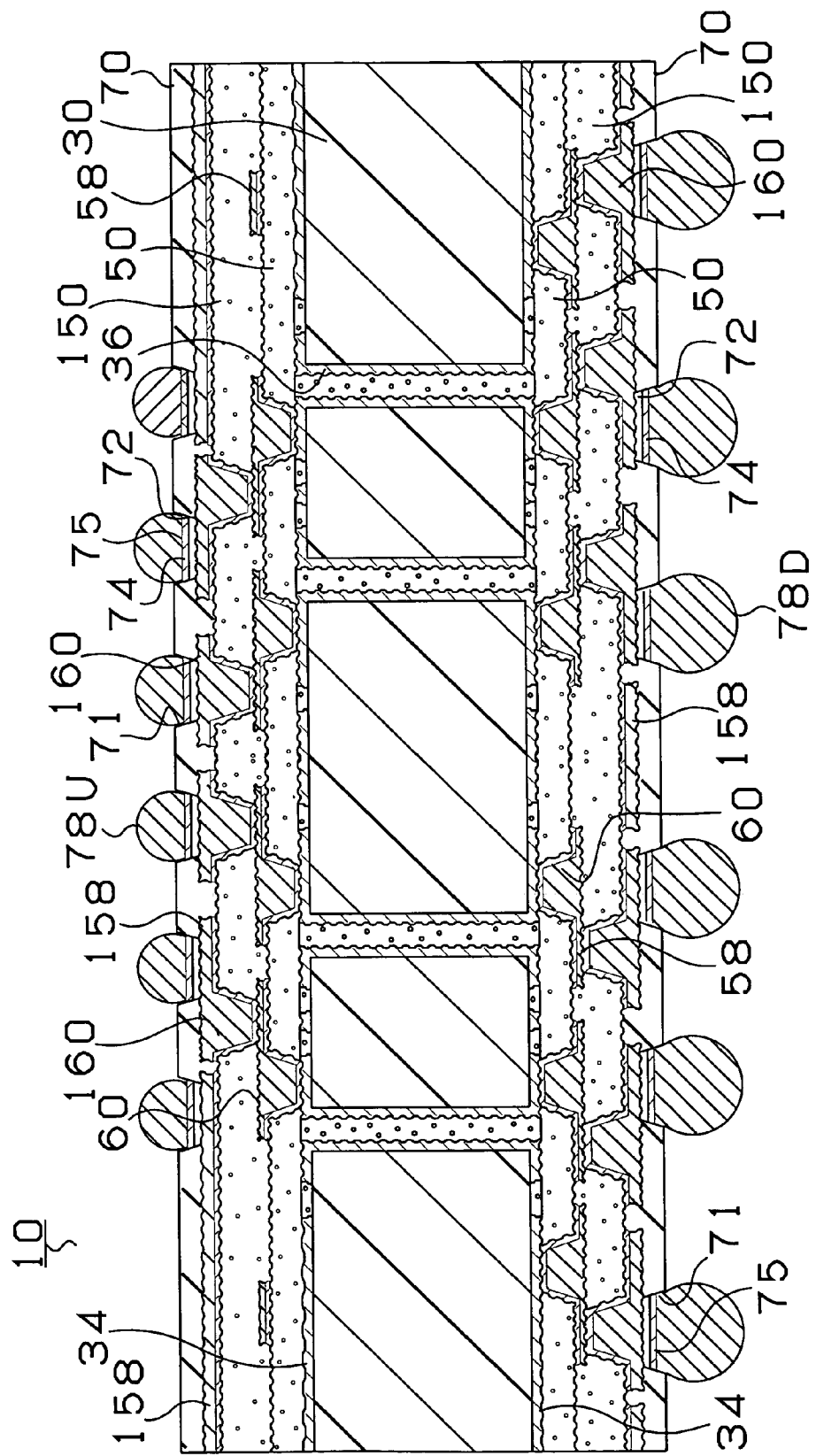
FIG. 6 is a sectional view of the multilayer printed wiring board.
Figure 7:
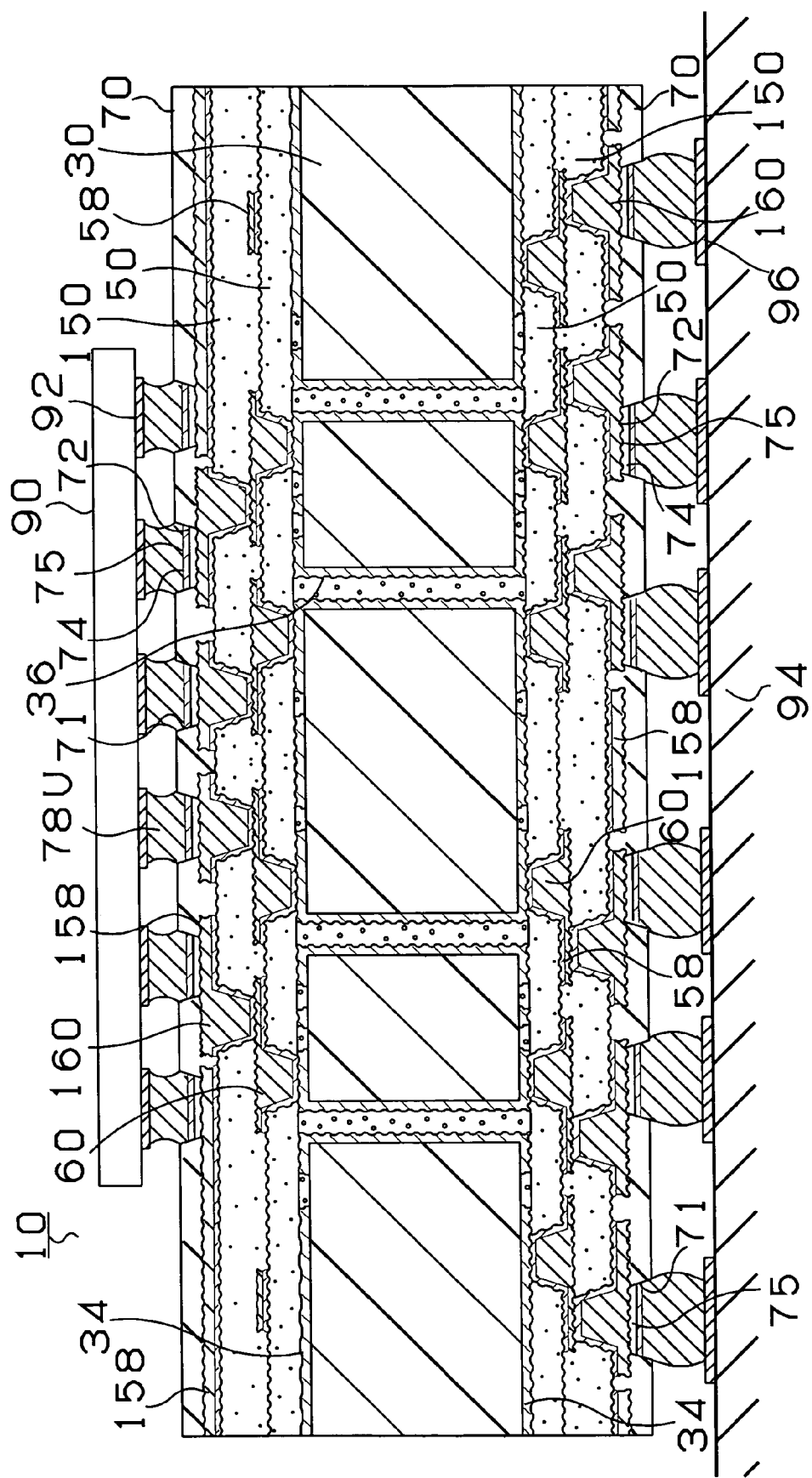
FIG. 7 is sectional view showing a condition in which a multilayer printed wiring board shown in FIG. 6, provided with an IC chip, is mounted on a daughter board.

First, the structure of the multilayer printed wiring board 10 to be manufactured with the solder ball loading method and loading unit of an embodiment of the present invention will be described with reference to FIGS. 6 and 7. FIG. 6 shows a sectional view of the multilayer printed wiring board 10 and FIG. 7 shows a condition in which the multilayer printed wiring board 10 shown in FIG. 6, on which an IC chip 90 is mounted, is loaded on a daughter board 94. In the multilayer printed wiring board 10 shown in FIG. 6, a conductor circuit 34 is formed on each of both surfaces of a core substrate 30. The top surface and rear surface of the core substrate 30 are connected via through holes 36.

Further, a conductor circuit 58 for forming a conductor circuit layer is formed on the conductor circuit 34 of the core substrate 30 via an interlayer resin insulation layer 50. The conductor circuit 58 is connected to the conductor circuit 34 via a via hole 60. A conductor circuit 158 is formed above the conductor circuit 58 via an interlayer resin insulation layer 150. The conductor circuit 158 is connected to the conductor circuit 58 via a via hole 160 formed on the interlayer resin insulation layer 150.

A solder resist layer 70 is formed on the via hole 160 and an upper layer of the conductor circuit 158 and a connection pad 75 is formed by providing a nickel plating layer 72 and a gold plating layer 74 on an opening 71 of the solder resist layer 70. A solder bump 78U is formed on the upper surface of the connection pad 75 and a BGA (ball grid array) 78D is formed on the lower surface of the connection pad 75.

As shown in FIG. 7, the solder bump 78U on the upper surface side of the multilayer printed wiring board 10 is connected to a land 92 of an IC chip 90. On the other hand, the BGA 78D on the bottom surface side is connected to a land 96 of the daughter board 94.

Figure 5:
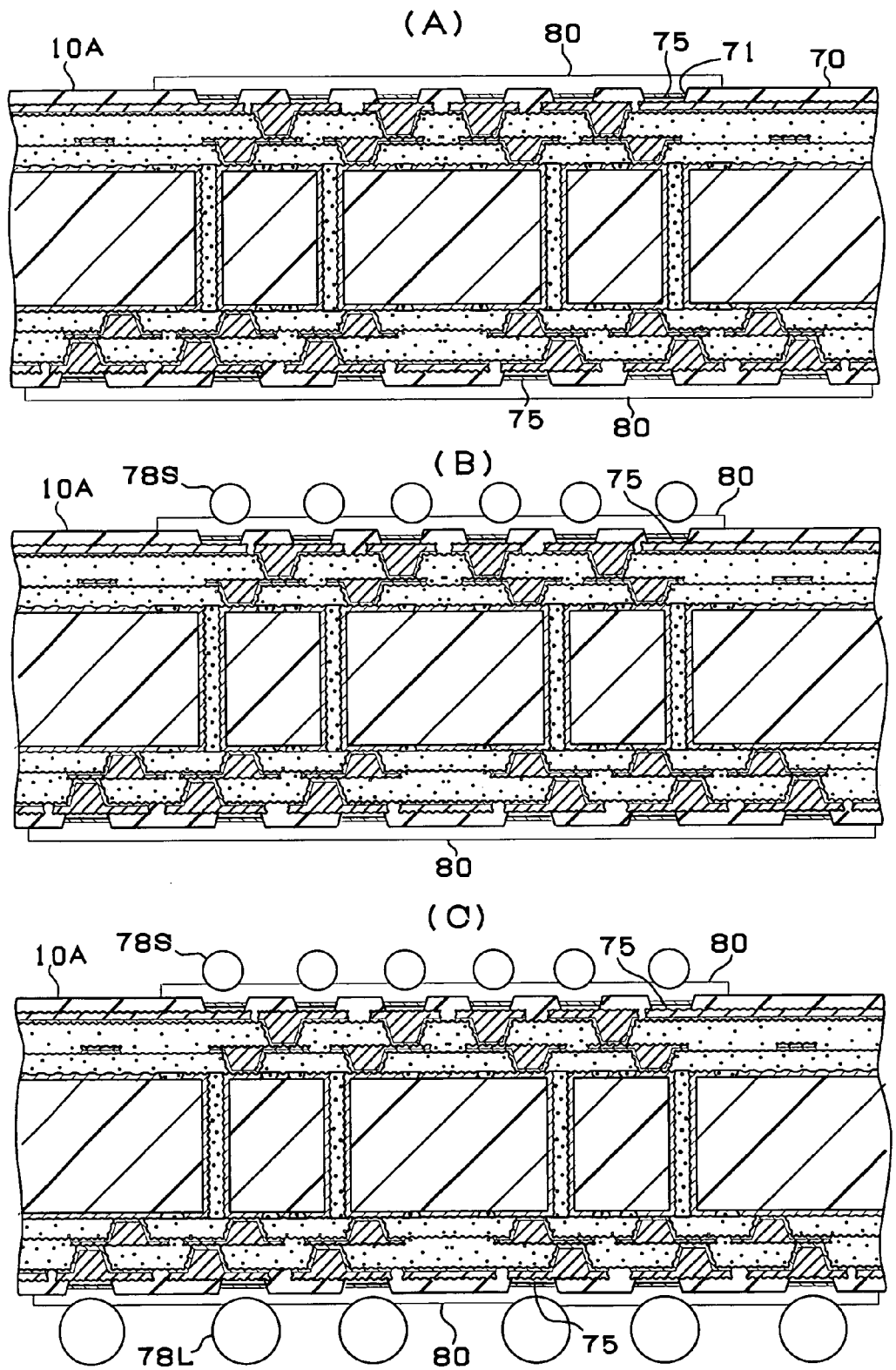
FIG. 5(A), FIG. 5(B), FIG. 5(C) are explanatory diagrams of manufacturing process of the multilayer printed wiring board.
Figure 8:
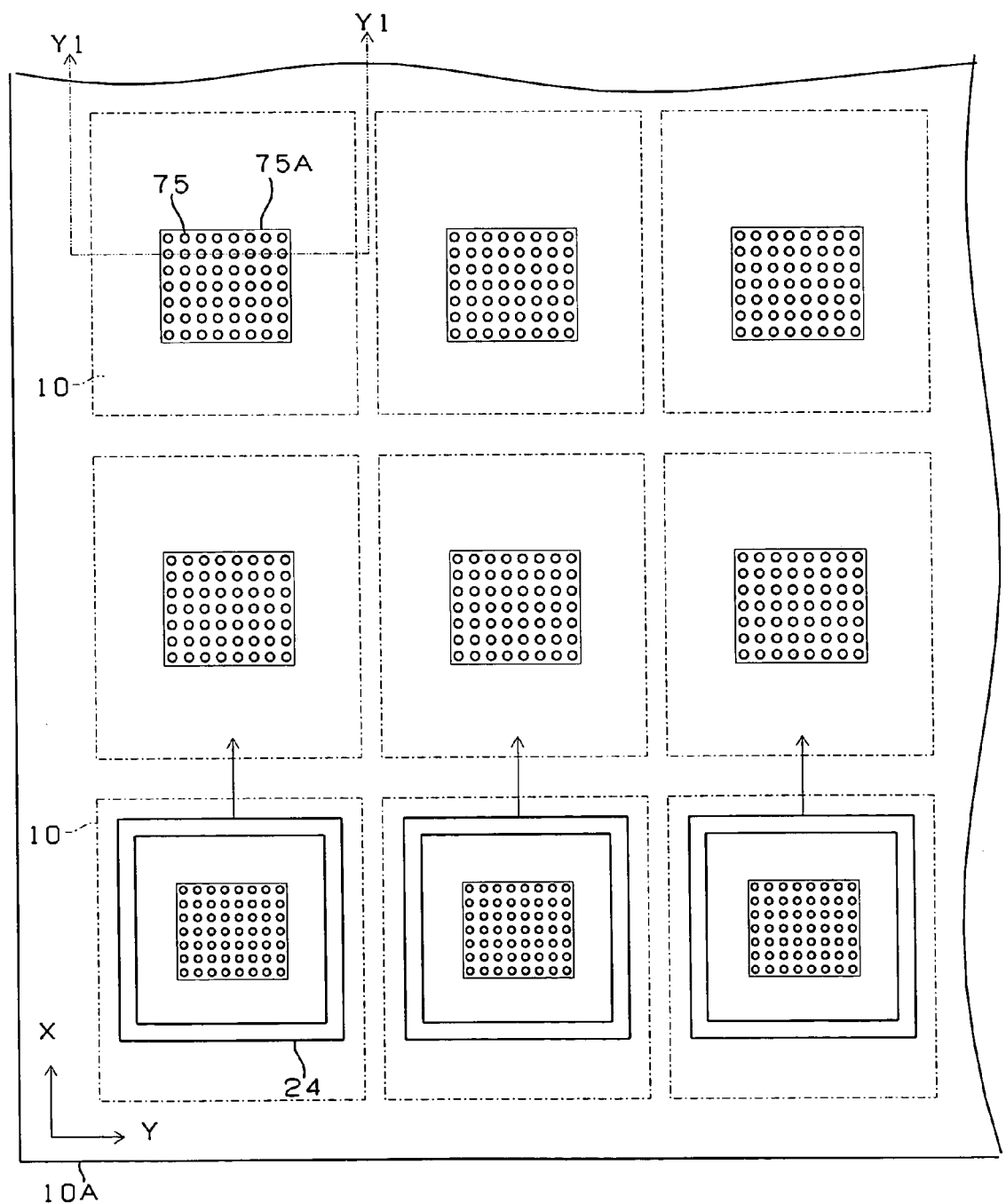
FIG. 8 is a plan view of a multilayer printed wiring board for securing multiple pieces.

FIG. 8 is a plan view of a multilayer printed wiring board 10A for securing multiple pieces of products. Individual multilayer printed wiring boards 10 each having a connection pad region 75A are obtained by cutting the multilayer printed wiring board 10A along a dot and dash line shown in the same Figure. FIG. 5 is an explanatory diagram of a process for forming solder bumps on the multilayer printed wiring board 10A for securing multiple pieces and corresponds to a sectional view taken along the line Y1-Y1 of FIG. 8. As shown in FIG. 5(A), flux 80 is printed on the surface of the multilayer printed wiring board 10A in which connection pads 75 are formed in openings 71 of the solder resist layer 70 on the front surface. As shown in FIG. 5(B), small solder balls 78s (for example, manufactured by Hitachi Metals, Ltd. or Tamura Corporation, 40 μm or more to less than 200 μm in diameter) are loaded on the connection pads 75 on the upper side of the multilayer printed wiring board 10A using a solder ball loading unit described later. A solder ball of its diameter less than 200 μm is preferred for corresponding to formation into a fine structure. If the diameter is less than 40 μm, the solder ball does not drop on the connection pad because it is too light. On the other hand, if the diameter exceeds 200 μm, the solder balls cannot be gathered within the cylinder member because it is too heavy, so that a connection pad on which no solder ball is placed exists. For the present invention, using a solder ball of its diameter 40 μm or more to less than 200 μm is significant. This is advantageous for formation into a fine structure in this range. A method for sucking the solder ball with a suction head and loading the solder ball onto the connection pad is difficult to suck the solder ball because it is small and therefore, evidently, the method of this embodiment is superior.

After that, the solder ball 78L of an ordinary diameter (250 μm in diameter) is sucked with the suction head according to conventional technology (for example, Japanese Patent No. 1975429) and loaded on the connection pad 75 on the bottom side of the multilayer printed wiring board 10A as shown in FIG. 5(C). After that, by heating with a reflow furnace as shown in FIG. 6, solder bumps 78U are formed on the upper side of the multilayer printed wiring board 10A at a pitch of 60 μm or more to less than 200 μm, in the quantity of, for example, 500 to 30,000 (corresponding to the quantity of the connection pads) and a BGA 78D are formed on the bottom side at a pitch of 2 mm, in the quantity of, for example, 250. If the quantity of the connection pads exceeds 2000, applying the present invention is significant because the connection pad region increases. Because this is carried out without any contact, the height of the bumps are stabilized and a solder bump having a low height is difficult to occur and therefore, a printed wiring board securing a high connection reliability can be provided. In the meantime, if the pitch is less than 60 μm, any solder ball suiting that pitch becomes difficult to be produced. If the pitch is over 200 μm, the conventional technology can manufacture it although this method can produce without any problem. Further, as shown in FIG. 7, after individual multilayer printed wiring boards 10 are obtained by cutting the multilayer printed wiring board 10A for securing multiple pieces, the IC chip 90 is loaded via the solder bumps 78U by reflowing and the multilayer printed wiring board 10, loaded with the IC chip 90, are mounted on the daughter board 94 via the BGA 78D.

The solder ball loading unit for loading the solder balls 78s having a fine diameter (less than 200 μm in diameter) on the connection pad of the multilayer printed wiring board described by referring to FIG. 5(B), will be described with reference to FIG. 1. FIG. 1(A) is a structure diagram showing the structure of a solder ball loading unit according to an embodiment of the present invention and FIG. 1(B) is a view taken as seen from an arrow B of the solder ball loading unit of FIG. 1(A).

The solder ball loading unit 20 comprises an XYθ suction table 14 for positioning and holding the multilayer printed wiring board 10A, a vertically movable shaft 12 for lifting up and down the XYθ suction table 14, a ball arranging mask 16 provided with an opening corresponding to the connection pad 75 of the multilayer printed wiring board, a loading cylinder (cylinderl member) 24 for introducing the solder balls moving on the ball arranging mask 16, a suction box 26 for supplying the loading cylinder 24 with negative pressure, an suction ball removing cylinder 61 for collecting excess solder balls, a suction box 66 for supplying the suction ball removing cylinder 61 with negative pressure, a suction ball removing suction unit 68 for holding the collected solder balls, a mask clamp 44 for clamping the ball arranging mask 16, an X-direction moving shaft 40 for feeding the loading cylinder 24 and the suction ball removing cylinder 61, a moving shaft supporting guide 42 for supporting the X-direction moving shaft 40, an alignment camera 46 for photographing the multilayer printed wiring board 10, a remainder detecting sensor 18 for detecting the remainder of the solder balls under the loading cylinder 24, and a solder ball supplying unit 22 for supplying the solder balls to the side of the loading cylinder 24 based on the remainder detected by the remainder detecting sensor 18. Although in the solder ball loading unit 20 shown in FIG. 1, only the X-direction moving shaft 40 for feeding the loading cylinder 24 and the suction ball removing cylinder 61 in the X-direction is indicated, it can be equipped with a moving mechanism for feeding in the Y-direction.

As shown in a plan view of FIG. 8, the plurality of the loading cylinder 24 and the suction ball removing cylinder 61 of the solder ball loading unit 20 are arranged along the Y direction corresponding to individual connection pad region 75A on the multilayer printed wiring board 10A for obtaining multiple pieces. In the meantime, although here, a single loading cylinder 24 corresponds to a single connection pad region 75A, the loading cylinder 24 may be constructed in a size corresponding to the plurality of connection pad regions 75A. The Y direction is set up for convenience here, and they may be arranged in the X direction. The XYθ suction table 14 positions, sucks, holds and corrects the multilayer printed wiring board 10 on which the solder balls are to be loaded. An alignment camera 46 detects an alignment mark on the multilayer printed wiring board 10 on the XYθ suction table 14 and based on a detected position, the positions of the multilayer printed wiring board 10 and the ball arranging mask 16 are adjusted. The remainder detecting sensor 18 detects the remainder of the solder ball according to an optical method.

Subsequently, the solder ball loading process by the solder ball loading unit 20 will be described with reference to FIGS. 2 to 4.

(1) Position Recognition and Correction of Multilayer Printed Wiring Board

An alignment mark 34M on the multilayer printed wiring board 10A for obtaining multiple pieces is recognized with the alignment camera 46 as shown in FIG. 2(A) and the position of the multilayer printed wiring board 10A relative to the ball arranging mask 16 is corrected with the XYθ suction table 14. That is, the position thereof is adjusted so that an opening 16a of the ball arranging mask 16 meets the connection pad 75 of the multilayer printed wiring board 10A respectively.

(2) Supply of Solder Balls

As shown in FIG. 2(B), the solder balls 78s are supplied in a predetermined quantity from the solder ball supply unit 22 to the side of the loading cylinder 24. In the meantime, the solder balls may be supplied into the loading cylinder beforehand.

(3) Loading of Solder Balls

As shown in FIG. 3(A), the loading cylinder 24 is positioned above the ball arranging mask 16 with a predetermined clearance relative to the ball arranging mask (for example, 0.5 to 4 times the ball diameter) and the air speed in a clearance between the loading cylinder and the printed wiring board is set to 5 m/sec to 35 m/sec by sucking air from the suction portion 24b so as to gather the solder balls 78s on the ball arranging mask 16 just below the opening portion 24A of the loading cylinder 24.

After that, as shown in FIGS. 3(B), 4(A) and 8, the loading cylinders 24 arranged along the Y axis of the multilayer printed wiring board 10A shown in FIGS. 1(B) and 1(A) are fed in a horizontal direction along the X axis via the X-direction moving shaft 40. As a consequence, the solder balls 78s gathered on the ball arranging mask 16 are moved as the loading cylinders 24 move and then, the solder balls 78s are dropped onto the connection pads 75 of the multilayer printed wiring board 10A via the opening 16a in the ball arranging mask 16 and loaded thereon. Consequently, the solder balls 78s are arranged in sequence on all the connection pads of the multilayer printed wiring board 10A.

(4) Removing of Adhering Solder Balls

After as shown in FIG. 4(B), excess solder balls 78s are introduced up to a position in which no opening 16a exists on the ball arranging mask 16 by the loading cylinder 24, they are removed by suction by means of the suction ball removing cylinder 61.

(5) Taking Out of a Board

The multilayer printed wiring board 10A is taken out from the XYθ suction table 14.

According to the solder ball loading method and solder ball loading unit 20 of the example 1 and an example 2-5 described later, the loading cylinder 24 is positioned above the ball arranging mask 16 and air is sucked from the suction portion 24B of the loading cylinder 24 so as to gather the solder balls 78s and then, by feeding the loading cylinder 24 horizontally, the gathered solder balls 78s are moved onto the ball arranging mask 16. Then, the solder balls 78s are dropped onto the connection pads 75 of the multilayer printed wiring board 10A via the opening 16a in the ball arranging mask 16. As a consequence, the fine solder balls 78s can be loaded on all the connection pads 75 of the multilayer printed wiring board 10A securely. Further, to move the solder balls 78s without any contact, the solder balls can be loaded on the connection pad 75 without being damaged, different from the method of using the squeegee, so that the heights of the solder bumps 78U can be equalized. Thus, this excels in performance of packaging of an electronic component such as IC, heat cycle test after installation, environmental resistance test such as high temperature/high humidity test. Further, because this is not dependent of flatness of a product, the solder balls can be loaded appropriately on the connection pad even if a printed wiring board has much unevenness on its surface. Further, because such fine solder balls can be loaded on the connection pads securely, all bumps can be formed as solder bumps stabilized in height even in such a printed wiring board in which the connection pad pitch is 60 to 150 μm and the solder resist opening diameter is 40 to 100 μm.

Because the solder ball is introduced with suction force in the example 1 and the example 2-5 described later, the solder balls can be prevented from coagulating or adhering. Further, because this can coincide with various kinds of work sheets (multilayer printed wiring board of work sheet size) by adjusting the quantity of the loading cylinders 24, it can be applied to production of multiple kinds of products each in a small quantity.

In the solder ball loading unit of the example 1 and the example 2-5 described later, as shown in FIG. 1(B), the plurality of the loading cylinders 24 are arranged along the Y direction corresponding to the width of the work sheet (multilayer printed wiring board of work sheet size). For the reason, only by feeding the plurality of loading cylinders 24 in a vertical direction (X direction) with respect to a column direction, the solder balls can be loaded on all the connection pads 75 of the multilayer printed wiring board 10A securely.

Further, because according to the example 1 and the example 2-5 described later, the solder balls 78s left on the ball arranging mask 16 can be collected by the suction ball removing cylinder 61, no excess solder ball is left, thereby not leading to a trouble.

EXAMPLE 1

(1) Production of Printed Wiring Board

By using a double-face copper clad laminate board (manufactured by, for example, Hitachi Chemical Co., Ltd., MCL-E-67), a through hole conductors and a conductor circuits were formed on this substrate according to a well known method. After that, according to a well known method (for example, "Built-up multilayer printed wiring board (written by KIYOSHI TAKAGI)" published by NIKKAN KOGYO SHINBUNSHA, Jun. 20, 2000), interlayer insulation layers and conductor circuit layers were laid alternately and in a conductor circuit layer on the outermost layer, a connection pad region was formed to be electrically connected to an IC, the connection pad region being formed of connection pads 50×50 (grid formation), each having 120 µm in diameter and at a pitch of 150 µm. Marketed solder resist was formed thereon and an opening 90 µm in diameter was formed on the connection pad according to photography method. The connection pad (solder bump being formed just above the via hole) composed of the via hole is preferred to be a filled via hole and the amount of its dent or the amount of protrusion (see FIG. 12) is preferred to be in the range of −5 to 5 µm with respect to the conductor thickness of the conductor circuit 158. If the amount of dent of the filled via exceeds 5 µm (−5 µm), the number of contact points between the solder ball and the connection pad comprising the filled via decreases, so that its wettability when it is turned to the solder bump worsens and consequently, void is wound into the solder or non-loading (missing bump) is likely to occur. On the other hand, if it exceeds 5 µm, this is not suitable for formation into a fine structure because the thickness of the conductor circuit 158 is increased.

To form a marketed solder resist (20 µm in film thickness) and expose a connection pad, openings of 90 µm in diameter were formed in the solder resist on the connection pad according to the photography method.

(2) Loading of Solder Ball

Marketed rosin base flux was applied to the surface (IC loading face) of a printed wiring board manufactured in (1). After that, the printed wiring board was mounted on the suction table of the solder ball loading unit of the present invention described above, and the alignment marks of the printed wiring board and the ball arranging mask were recognized with a CCD camera so as to match the position of the printed wiring board with that of the ball arranging mask. Here, as the ball arranging mask, a Ni made metal mask having openings of 110 µm in diameter at positions corresponding to the connection pads of the printed wiring board was used. The thickness of the metal mask is preferred to be ¼ to ¾ the solder ball. Although the Ni made metal mask was used here, it is permissible to use a ball arranging mask made of SUS or polyimide. In the meantime, the diameter of an opening formed in the ball arranging mask is preferred to be 1.1 to 1.5 times the diameter of a ball for use. Next, a SUS made loading cylinder 200 mm in height and having a size corresponding to the connection pad region (1.1 to 4 times a region in which the connection pads are formed) was positioned above the metal mask (ball arranging mask) with a clearance 0.5 to 4 times the diameter of the solder ball maintained and Sn63Pb37 solder balls (manufactured by Hitachi Metals, Ltd.) of 80 µm in diameter were loaded on the ball arranging mask around it.

Although according to the example 1, Sn/Pb solder was used as the solder ball, it is permissible to use Pb free solder selected from a group of Sn and Ag, Cu, In, Bi, Zn and the like. The air speed in a clearance between the loading cylinder and the printed wiring board was adjusted to 5 to 35 m/sec by sucking air through the top of the loading cylinder so as to gather within the loading cylinder. After that, the solder balls were moved by feeding the loading cylinder at a moving speed of 10 to 40 mm/sec and the solder balls were dropped through opening portions in the ball arranging mask and loadid on the connection pads. Next, after removing excess solder balls from the ball arranging mask, the solder ball arranging mask and the printed wiring board were removed form the solder ball loading unit individually. Finally, a printed wiring board loaded with the solder balls in the above (2) was charged to reflow process set at 230° C. so as to create the solder bumps.

EXAMPLE 2

The example 2 will be described with reference to FIGS. 9 and 10. According to the example 1 described above, a clearance (gap) between a bottom end opening portion 240 of the loading cylinder 24 and the arranging mask 16 was formed to a constant one. Contrary to this, according to the example 2, the clearance differs in the back and forth direction and in the right and left direction with respect to the moving direction of the loading cylinder 24. FIG. 9(A) is a front view of the loading cylinder 24 as viewed from the side of advancing direction, FIG. 9(B) is a side view thereof and FIG. 9(C) is a plan view of the loading cylinder 24 as viewed from above. The loading cylinder 24 is constructed in the form of a cube and Gap 1 between a front wall 24F on the front side in the advancing direction and a rear wall 24R and the ball arranging mask 16 is larger than Gap 2 between the right wall 24r and a left wall 24l on the right and left sides in the advancing direction and the ball arranging mask 16. That is, the right wall 24r and the left wall 24l are constructed to extend downward relative to the front wall 24F and the rear wall 24R.

FIG. 10(A) is a schematic diagram for explaining the motions of the solder balls when the clearances of the loading cylinder are equal in the back and forth direction and in the right and left direction. If the clearances of the loading cylinder are equal in the back and forth direction and in the right and left direction as shown in FIG. 10(A), forces applied to the solder ball group 78G from four directions (back and forth, right and left) by air flow going in through the clearance become equal, so that the collision frequency of the solder balls with each other rises within the loading cylinder 24 in which they are gathered by air flow, particularly at a central position and consequently, the solder balls become difficult to drop into the opening 16a of the mask.

FIG. 10(B) is a schematic diagram for explaining the motions of the solder balls when the clearances of the loading cylinder according to the example 2 are different between in the back and forth direction and in the right and left direction. If the clearances are different between in the back and forth direction and the right and left direction, forces applied to the solder ball group 78G from four directions (back and forth, right and left) by air flow going through the clearances become unequal, so that the collision frequency of the solder balls with each other within the loading cylinder 24 in which they are gathered by air flow lowers and consequently, the solder balls become easy to drop into the opening 16a of the mask. In the meantime, it was made evident that the speed of air flow going in through the clearances on the front and rear sides was not so different from the speed of air flow going in through the clearances on the right and left sides as a result of measurement. That is, it was made evident that although the air speed does not differ so much depending on the clearance, the amount of air going in changed and the amount of work done changed.

The larger the clearance on the front and rear sides of the loading cylinder 24 than the clearance on the right and left sides as shown in FIG. 9(C), the better. If the clearance on the front and rear sides is larger than the clearance on the right and left sides, the solder balls can be moved in the back and forth direction with respect to the advancing direction within the loading cylinder 24 with a moving of the loading cylinder 24. That is, although if the loading cylinder 24 is stationary as shown in FIG. 9(C1), the solder balls are gathered in the center within the loading cylinder, if the loading cylinder 24 is moved to the left side in the same Figure, the solder ball group 78G moves late from the moving of the loading cylinder 24 and consequently, as shown in FIG. 10(C2), the relative position of the solder ball group 78G moves backward with respect to the central position of the loading cylinder 24 in a while. After that, the solder ball group 78G comes to the front side across the central position due to air flow from backward (FIG. 10(C3)). Further, it is moved backward by air flow from forward. That is, with a moving of the loading cylinder 24, the solder ball group 78G comes to move back and forth with respect to the advancing direction from the central position of the loading cylinder 24, so that the solder balls become difficult to drop into the opening 16a of the mask.

Because according to the solder ball loading unit of the example 2, the opening portion of the loading cylinder 24 is defined in a substantially rectangular form, the solder balls are gathered as the solder ball group 78G in the substantially rectangular form as shown in FIG. 10(C1), so that the solder balls can be loaded on individual connection pads 75 in the substantially rectangular connection pad region 75A indicated in FIG. 8 effectively. Although according to the solder ball loading unit 20 of the example 2, the opening portion of the loading cylinder 24 is formed in a substantially rectangular form, it may be formed in a cylindrical form or elliptic form or the clearance on the front and rear sides may be made different from the clearance on the right and left sides.

[Evaluation Test of Example 1]

A result of comparison test carried out on a solder bump produced according to the solder ball loading method of the example 1 in which the clearances on the front/rear sides and the right/left sides of the loading cylinder 24 described above are equal and a solder bump (comparative example 1) produced according to a conventional technology will be described.

COMPARATIVE EXAMPLE

The comparative example 1 is the same as the example 1 except that a method for supplying the solder balls to the connection pad was changed. That is, using the conventional technology, the solder balls were carried with a squeegee and dropped through the opening portions for ball loading and loaded on the connection pads.

[Evaluation Test]

After reflow, the heights of the bumps from the solder resist were measured about 50 pieces at random with a laser microscope VX-8500 manufactured by KEYENCE. In the comparative example 1, there were connection pads (missing bumps) loaded with no bump. The missing bumps were excluded from the measurement object.

[Result]

|  | Bump height | Dispersion of bump height |
| --- | --- | --- |
| Example 1 | 35.22 μm | 1.26 |
| Comparative example 1 | 32.64 μm | 4.18 |

From this result, it is evident that even if the same solder balls are used, the bumps of the example 1 of the present invention are high and dispersion of the height of the bumps is small. This reason is that because according to the example 1, the solder balls are never scraped by a squeegee or the like, the solder balls maintain its initial volume when they are loaded on the connection pad.

500 pieces of the printed wiring boards obtained in the example 1 and the comparative example 1 were prepared and loaded on an IC. The IC loaded substrate was checked in conductivity so as to obtain yield. The result is that although it was 90% for the printed wiring board of the example 1, it was 3% in the comparative example 1. After that, 10 samples were picked out form acceptable products at random, heat cycle test was carried out for 1,000 times with −55×5 minutes to 125×5 minutes as a single cycle so as to measure the amount of change of connection resistance of a specified circuit connected with the rear surface of the printed wiring board through the IC from the rear surface (opposite face to the IC loaded surface) of the printed wiring board. The amount of change of the connection resistance ((connection resistance after heat cycle−connection resistance as initial value)/connection resistance as initial value)×100. If this value exceeds 10%, the product is unacceptable.

|  | Quantity of unacceptable products | Percentage of acceptable products |
| --- | --- | --- |
| Example 1 | 0 | 100% |
| Comparative example 1 | 10 | 0% |

From this result, it is evident that because dispersion of bump height is small, the connection reliability at the bumps is high. Contrary to this, according to the method of the comparative example 1, acceptable products which can guarantee the reliability are 0%.

[Evaluation Test of Example 2]

A result of comparison test about solder bumps manufactured according to the solder ball loading method of the example 2 in which the clearances on the front/rear sides and right/left sides of the loading cylinder 24 are unequal, according to the solder ball loading method of the example 1 in which the aforementioned clearances are equal and according to a conventional technology (comparative example 1 described above), will be described with reference to FIGS. 9 and 10.

EXAMPLE 1-1

According to the example 1-1, with the Gap 1 front and Gap 1 rear of the loading cylinder 24 set to 0.15 mm and the Gap 2 right and Gap 2 left set to 0.15 mm (Gap 1=Gap 2), a test piece was produced in the same manner as the example 1. The front, rear, right and left here refer to front/rear and right/left with respect to the advancing direction of the loading cylinder.

EXAMPLE 1-2

According to the example 1-2, with the gap 1 front and Gap 1 rear of the loading cylinder 24 set to 0.2 mm and the Gap 2 right and Gap 2 left set to 0.2 mm (Gap 1=Gap 2), a test piece was produced in the same manner as the example 1.

EXAMPLE 2-1

According to the example 2-1, with the Gap 1 front and Gap 1 rear of the loading cylinder 24 set to 0.18 mm and the Gap 2 right and Gap 2 left set to 0.15 mm (Gap 1=1.2×Gap 2), a test piece was produced in the same manner as the example 2.

EXAMPLE 2-2

According to the example 2-2, with the Gap 1 front and Gap 1 rear of the loading cylinder 24 set to 0.225 mm and the Gap 2 right and Gap 2 left set to 0.15 mm (Gap 1=1.5×Gap 2), a test piece was produced in the same manner as the example 2.

EXAMPLE 2-3

According to the example 2-3, with the Gap 1 front and Gap 1 rear of the loading cylinder 24 set to 0.3 mm and the Gap 2 right and Gap 2 left set to 0.15 mm (Gap 1=2×Gap 2), a test piece was produced in the same manner as the example 2.

EXAMPLE 2-4

According to the example 2-4, with the Gap 1 front and Gap 1 rear of the loading cylinder 24 set to 0.6 mm and the Gap 2 right and Gap 2 left set to 0.15 mm (Gap 1=4×Gap 2), a test piece was produced in the same manner as the example 2.

EXAMPLE 2-5

According to the example 2-5, with the Gap 1 front and Gap 1 rear of the loading cylinder 24 set to 0.24 mm and the Gap 2 right and Gap 2 left set to 0.2 mm (Gap 1=1.2×Gap 2), a test piece was produced in the same manner as the example 2.

EXAMPLE 2-6

According to the example 2-6, with the Gap 1 front and Gap 1 rear of the loading cylinder 24 set to 0.4 mm and the G 2 right and Gap 2 left set to 0.2 mm (Gap 1=2×Gap 2), a test piece was produced in the same manner as the example 2.

EXAMPLE 2-7

According to the example 2-7, with the Gap 1 front and Gap 1 rear of the loading cylinder 24 set to 0.75 mm and the Gap 2 right and Gap 2 left set to 0.25 mm (Gap 1=3×Gap 2), a test piece was produced in the same manner as the example 2.

EXAMPLE 2-8

According to the example 2-8, with the Gap 1 front and Gap 1 rear of the loading cylinder 24 set to 1.2 mm and the Gap 2 right and Gap 2 left set to 0.3 mm (Gap 1=4×Gap 2), a test piece was produced in the same manner as the example 2.

EXAMPLE 2-9

According to the example 2-9, with the Gap 1 front of the loading cylinder 24 set to 0.18 mm and Gap 1 rear set to 0.2 mm and the Gap 2 right set to 0.15 mm and Gap 2 left set to 0.14 mm, a test piece was produced in the same manner as the example 2.

EXAMPLE 2-10

According to the example 2-10, with the Gap 1 front of the loading cylinder 24 set to 0.4 mm and Gap 1 rear set to 0.45 mm and the Gap 2 right set to 0.2 mm and Gap 2 left set to 0.15 mm, a test piece was produced in the same manner as the example 2.

EXAMPLE 2-11

According to the example 2-11, with the Gap 1 front and Gap 1 rear of the loading cylinder 24 set to 0.06 mm and the Gap 2 right and Gap 2 left set to 0.04 mm (Gap 1=1.5×Gap 2), a test piece was produced in the same manner as the example 2.

EXAMPLE 2-12

According to the example 2-12, with the Gap 1 front and Gap 1 rear of the loading cylinder 24 set to 0.1 mm and the Gap 2 right and Gap 2 left set to 0.08 mm (Gap 1=1.25×Gap 2), a test piece was produced in the same manner as the example 2.

EXAMPLE 2-13

According to the example 2-12, with the Gap 1 front and Gap 1 rear of the loading cylinder 24 set to 0.08 mm and the Gap 2 right and Gap 2 left set to 0.1 mm (Gap 1=0.8×Gap 2), a test piece was produced in the same manner as the example 2.

(Evaluation Test 1)

500 pieces of the solder ball provided printed wiring boards of each example were produced and an IC was loaded on each of them. A yield was obtained by checking conductivity of an IC loaded substrate. This result is indicated in Table of FIG. 11. According to the comparative example 1, only 3% acceptable products were obtained. From this result, it was made evident that the yield could be increased by making different the clearance on the front and rear sides of the loading cylinder 24 from the clearance on the right and left sides and particularly, the yield could be raised up to 100% by making the clearance on the front and rear sides larger than the clearance on the right and left sides.

(Evaluation Test 2)

Heat cycle test was carried out with −55×5 minutes to 125×5 minutes as a single cycle to printed wiring boards (N=10) obtained according to the example 1, example 2 and comparative example 1 recognized to be acceptable in conductivity check test for 1,000 times so as to measure the amount of change of connection resistance of a specified circuit connected to the rear surface of the printed wiring board through the IC from the rear surface (opposite surface to the IC loading face) of the printed wiring board. The amount of connection resistance is ((connection resistance after heat cycle−connection resistance as initial value))/connection resistance as initial value)×100. If this value is less than ±3%, it is recognized to be good product (○ in FIG. 11). If the value is 3%-10% or −3% to −10%, it is recognized to be acceptable (Δ in FIG. 11) and in other cases (over 10% or less than −10%), it is recognized to be bad (X in FIG. 11). From this result, it is evident that the electric characteristic can be improved by making different at least one of the clearances on the front and rear sides and right and left sides of the loading cylinder 24. This reason is estimated to be that missing of the solder ball decreases because the collision frequency of the solder ball decreases so that the volume of the solder bump is stabilized. Further, the reason is that because the amount of air is appropriate in a range in which the Gap1/Gap2 is less than 3, missing of the solder ball due to collision with each other is small and thus the electric characteristic (connection reliability) can be improved.

Comparative Example 2

According to the comparative example 2, the solder bumps were formed using solder paste instead of the solder ball in the manner of the example 1.

The heights of the solder bumps (height projecting from the solder resist) of the example 1 and comparative example 2 were measured with WYKO "NT2000" manufactured by VEECO INSTRUMENTS and dispersion (σ) thereof was calculated. Its result is as follows.

| | |
|---|---|
| Example 1 | 1.26 |
| Comparative example 2 | 2.84 |

An IC was mounted on the printed wiring boards of the example 1 and comparative example 2 and under-fill was charged between the IC and the printed wiring board to prepare an IC loaded printed wiring board. After that, connection resistance of a specified circuit connected to the rear surface of the IC loaded printed wiring board through the IC was measured from the rear surface (opposite side to the IC loaded surface) of the IC loaded printed wiring board and prepared as an initial value. After the initial value was measured, it was left in the atmosphere of 85° C.×80% for 15 hours and heat cycle test was carried out with −55° C.×5 minutes to 125°×5 minutes as a single cycle, for 1,000 times so as to measure the connection resistance to investigate the connection reliability. In the meantime, the amount of change of connection resistance is expressed by ((connection resistance after heat cycle−connection resistance as initial value)/connection resistance as initial value)×100 and if the value is less than ±10%, the product is acceptable and if it is over the value, it is unacceptable. As a result, the example 1 was acceptable and the comparative example 2 was unacceptable.

EXAMPLE 3

The structure of the multilayer printed wiring board 10 manufactured using the solder ball loading method and loading unit of the example 3 of the present invention will be described. The structure of the multilayer printed wiring board 10 of the example 3 is the same as the example 1 described with reference to FIGS. 6 and 7. The manufacturing process is the same as the example 1 described with reference to FIG. 5. Further, the solder ball loading unit of the example 3 is substantially the same as the example 1 described with reference to FIG. 1 except the structure of the loading cylinder 24.

FIG. 13(A) is an explanatory diagram showing the connection pad region 75A on the multilayer printed wiring board 10A in FIG. 8 and the loading cylinder 24 of the example 3 in enlargement.

In the loading cylinder 24, its opening portion 24A at the bottom end (see FIG. 2(B)) is formed in a rectangular form. Thus, the solder balls can be gathered in the substantially rectangular form and the solder balls can be loaded effectively on the connection pad 75 within the substantially rectangular connection pad region 75A. Here, the length ax of a side (length of inner wall) 24X parallel to the loading cylinder moving direction of the opening portion is set a (1.1 to 4) times a length x of a side 75X parallel to the loading cylinder moving direction (X direction) of the connection pad region 75A. On the other hand, a length by of a side (length of the inner wall) 24Y perpendicular to the loading cylinder moving direction (Y direction) of the opening portion is set b (1.1 to 4) times a length y of a side 75Y perpendicular to the loading cylinder moving direction of the connection pad region 75A. Thus, the solder balls can be gathered in the connection pad region 75A of the printed wiring board. The connection pad region mentioned here refers to an area 75A in FIG. 13(A), which is a rectangular area containing a connection pad located on the outermost periphery while its area is minimum. In the meantime, x, y in case where the connection pad 75 is not disposed in a rectangular shape as shown in FIG. 13(C) are set so that the connection pads on the outermost periphery are contained while the rectangular area of the connection pad region 75A is minimum.

According to the example 3, a ratio a between the length of a side 24X parallel to the cylinder moving direction (X direction) of an opening portion in the loading cylinder 24 and the length of a side 75X parallel to the loading cylinder moving direction of the connection pad region 75A is set larger than a ratio b between the length of a side 24Y perpendicular to the loading cylinder moving direction of the opening portion and the length of a side 75Y perpendicular to the loading cylinder moving direction of the connection pad region 75A. Thus, the solder ball group 78G can be formed longer in the moving direction (X direction) of the loading cylinder 24 with respect to the connection pad region 75A in the substantially rectangular form as shown in FIG. 13(B) and when the loading cylinder 24 is moved in the X direction, the solder balls can be loaded effectively on the connection pads 75 in the connection pad region 75A in the substantially rectangular form.

According to the example 3, the loading cylinder 24 is constructed of conductive metal such as SUS stainless, Ni and Cu and grounded to the side of the solder ball loading unit 20. Even if the solder balls are charged due to mutual collision when they are carried on the ball arranging mask 16, light solder balls having a small diameter never adhere to the loading cylinder 24 because of static electricity, so that the solder balls can be loaded on the printed wiring board securely.

As shown in the plan view of FIG. 8, the plurality of the loading cylinders 24 and the plurality of the suction ball removing cylinders 61 of the solder ball loading unit 20 are arranged along the Y direction corresponding to individual connection pad regions 75A on the multilayer printed wiring board 10A for obtaining multiple pieces. Although a single connection pad region 75A corresponds to a single loading cylinder 24, the loading cylinder 24 may be formed in a size corresponding to the plurality of connection pad regions 75A. Here, the Y direction is set for convenience and they may be arranged along the X direction. The XYθ suction table 14 positions, sucks, holds and corrects the multilayer printed wiring board 10 on which the solder balls are to be loaded. The alignment camera 46 detects an alignment mark on the multilayer printed wiring board 10 on the XYθ suction table 14 and the positions of the multilayer printed wiring board 10 and the ball arranging mask 16 are adjusted based on the detected position. The remainder detecting sensor 18 detects the remainder of the solder ball according to an optical method.

Because the solder ball loading process according to the solder ball loading unit 20 of the example 3 is the same as the example 1 described with reference to FIGS. 2 to 4, description thereof is omitted.

EXAMPLE 3-1

(1) Production of Printed Wiring Board

A double side copper clad laminate board (manufactured by, for example, Hitachi Chemical Co., Ltd. MCL-E-67) was used as a starring material and through hole conductors and conductor circuits were formed in this substrate according to a well known method. After that, an interlayer insulation layers and an conductor circuit layers were laid alternately according to a well known method (for example, "Built-up multilayer printed wiring board" (written by KIYOSHI TAKAGI), published by NIKANN-KOGYO SHINBUN-SHA, Jun. 20, 2000) so as to form a connection pad group to be connected electrically to the IC in the conductor circuit layer on the outermost layer. As for the connection pad group, 2000 pieces of connection pads of 120 μm in diameter are formed within a connection pad region (70 mm²: 10 mm×7 mm) and most of them are disposed in the form of a grid at a pitch of 150 μm. The connection pad (solder bump is formed just above the via hole) composed of a via hole is preferred to be a filled via hole and the amount of its dent or the amount of protrusion (see FIG. 12) is preferred to be in a range of −5 to 5 mm with respect to the thickness of conductor of the conductor circuit 158. Because the number of contact points between the solder ball and the connection pad composed of the filled via decreases if the amount of the dent of the filled via exceeds 5 μm (−5 μm), wettability at the time when the solder bump is formed worsens so that void is wound into the solder or non-loading of the solder ball is likely to occur (missing bump). On the other hand, if the thickness exceeds 5 μm, the thickness of the conductor circuit 158 increases and this is not suitable for formation into a fine structure.

A marketed solder resist was formed thereon (in the thickness of 20 μm) and an opening of 90 μm in diameter was formed in the solder resist on the connection pad according to photography method in order to expose the connection pad.

(2) Loading of Solder Balls

Marketed rosin base flux was applied to the surface (IC loading face) of a printed wiring board produced in (1). After that, this was mounted on a suction table of the solder ball loading unit of the present invention described above and alignment marks on the printed wiring board and the ball arranging mask were recognized with a CCD camera so as to match the position of the printed wiring board with that of the ball arranging mask. As a ball arranging mask, a Ni made metal mask having an opening of 110 μm in diameter at a position corresponding to the connection pad of the printed wiring board was used. The thickness of the metal mask is preferred to be ¼ to ¾ of the solder ball. Although the Ni made metal mask is used, it is permissible to use a ball arranging mask made of SUS or polyimide. The diameter of an opening formed in the ball arranging mask is preferred to be 1.1 to 1.5 times the diameter of a ball for use. Next, a loading cylinder made of SUS having a size corresponding to the connection pad region (1.1 to 4 times an area in which the connection pad is formed) and 200 mm in height was positioned above the metal mask (ball arranging mask) with a clearance of 0.5 to 4 times the diameter of the solder ball and an Sn63Pb37 solder ball (manufactured by Hitachi Metals Ltd.) of 80 μm in diameter was loaded on the ball arranging mask around it. Although as the solder ball, Sn/Pb solder was used according to the example 3-1, it is permissible to use Pb free solder selected from Sn, Ag, Cu, In, Bi, Zn and the like.

By sucking air from the suction portion (5 to 20 mm in diameter) 24B (see FIG. 2(B)) at the top portion of the loading cylinder, a following equation was satisfied so that the solder balls were gathered on the ball arranging mask within the loading cylinder.

"air speed in a clearance between the loading cylinder and the ball arranging mask>air speed within the loading cylinder and speed of natural drop of the solder ball>air speed within the loading cylinder (except air speed in the suction portion)"

To satisfy the above-described relation equation, following main parameters are adjusted.

Parameter (1): amount of suction from the suction portion 24b at the top portion of the loading cylinder (2 L/min to 500 L/min)

Parameter (2): clearance between the loading cylinder and the ball arranging mask (0.5 to 2.5 times the diameter of the solder ball)

Parameter (3): area of the opening portion 24(A) at the bottom end of the loading cylinder (see FIG. 2(B) and FIG. 13)

The air speed between the loading cylinder and the ball arranging mask can be adjusted to 5 to 35 m/sec and the air speed within the loading cylinder can be adjusted to 0.1 m/sec to 2 m/sec.

After that, by feeding the loading cylinder at a moving speed of 20 mm/sec, the solder balls were moved and dropped through the opening portions in the ball arranging mask and loaded on the connection pad. According to the example 3-1, the loading cylinder 24 is constituted of conductive metal such as SUS stainless, Ni, Cu and grounded to the side of the solder ball loading unit 20. Next, excess balls were removed from the ball arranging mask and then, the solder ball arranging mask and the printed wiring board were removed from the solder ball loading unit individually. Finally, the printed wiring board produced in the previous step was charged to reflow set at 230° C. to prepare a solder ball provided printed wiring board.

EXAMPLE 3-2

According to the example 3-2, a printed wiring board was produced in the same manner as the example 3-1 and as the solder ball of 80 μm in diameter was used. As the loading cylinder 24, as shown in FIG. 14(A), a conductive resin made loading cylinder 24 in which black lead powder was mixed was used. Although conductive plastic resin was used here, it is permissible to use conductive rubber in which metallic powder was mixed or the like instead of this. The example 3-2 has such an advantage that the ball arranging mask is never damaged even if a front end of the loading cylinder 24 makes contact with the ball arranging mask 16.

EXAMPLE 3-3

According to the example 3-3, a printed wiring board was produced in the same manner as the example 3-1 and as the solder ball of 80 mm in diameter was used. As the loading cylinder 24, as shown in FIG. 14(B), one in which the surface of a resin core member 21 was covered with conductive metallic film 23 such as aluminum by deposition was used. The example 3-3 has such an advantage that the loading cylinder 24 can be manufactured at a cheap price.

EXAMPLE 3-4

According to the example 3-4, a printed wiring board was produced in the same manner as the example 3-1 and as the solder ball of 80 μm in diameter was used. As the loading cylinder 24 as shown in FIG. 14(C), one in which a conductive metal foil 23f such as copper foil was pasted to the bottom end and inner peripheral face of the resin core member 21 was used. This conductive metal foil 23f is grounded to the main body side of the solder ball loading unit 20 through a grounding wire. The example 3-4 has such an advantage that the loading cylinder 24 can be produced at a cheap price.

REFERENCE EXAMPLE 3

According to the reference example 3, a printed wiring board was produced in the same manner as the example 3-1 and as the solder ball of 80 μm in diameter was used. The loading cylinder 24 is constituted of insulating resin.

Comparative Example 3-1

According to the example 3-1, solder balls of 80 μm in diameter were loaded on a printed wiring board using a ball arranging squeegee as conventional technology says.
(Evaluation Test)
100 pieces of the solder ball provided printed wiring boards of the examples 3-1 to 3-3 and reference example 3 and comparative example 3-1 were produced and whether or not there was any solder bump on each of all the connection pads of the printed wiring board was recognized (microscope of 10 magnifications). Then, a printed wiring board in which the solder bumps were formed on all the connection pads was recognized to be acceptable product and a printed wiring board having a connection pad on which no solder bump was formed was recognized to be an unacceptable product. By counting the quantity of acceptable printed wiring boards, the yield was obtained (quantity of acceptable printed wiring boards/10×100%). This result is as follows.
Example 3-1: yield=100%
Example 3-2: yield=100%
Example 3-3: yield=100%
Example 3-4: yield=100%
Reference example 3: yield=70%
Comparative example 3-1: yield=3%

From the evaluation test, it was evident that the yield could be raised by constructing at least a solder ball contact portion of the loading cylinder 24 with conductive member, as compared with the reference example 3. Further, it was made evident that a method of using the squeegee of the comparative example 3-1 was incapable of loading the solder ball 80 μm in diameter on the printed wiring board.

Comparative Example 3-2

According to the comparative example 3-2, the solder bumps were formed using solder paste instead of solder ball in the same manner as the example 3-1.

The heights of 500 pieces of the solder bump (height projecting from the solder resist) of the example 3-1 and the comparative example 3-2 were measured with a WYKO "NT2000" manufactured by VEECO INSTRUMENTS and its dispersion (σ) was calculated. Its result is as follows.

| | |
|---|---|
| Example 3-1 | 1.26 |
| Comparative example 3-2 | 2.84 |

An IC was mounted on the printed wiring boards of the example 3-1 and comparative example 3-2 and under-fill was charged between the IC and the printed wiring board so as to prepare an IC loaded printed wiring board. After that, connection resistance of a specified circuit connected to the rear surface of the IC loaded printed wiring board through the IC was measured from the rear surface (opposite side to the IC loaded face) of the IC loaded printed wiring board as an initial value. After the initial value was measured, it was left in the atmosphere of 85° C.×80% for 15 hours and then, heat cycle test was carried out for 1,000 times with −55° C.×5 minutes to 125° C.×5 minutes as a single cycle and the connection resistance was measured again to investigate the connection reliability. In the meantime, the amount of change of connection resistance is expressed by ((connection resistance after heat cycle−connection resistance as an initial value)/connection resistance as an initial value)×100. If the value is within +10%, the product is acceptable and if it is over that value, the product is unacceptable. As for the result, the example 3-1 was acceptable and the comparative example 3-2 was unacceptable.

EXAMPLE 4

The structure of the multilayer printed wiring board 10 manufactured using the solder ball loading method and loading unit of the example 4 of the present invention will be described. The structure of the multilayer printed wiring board 10 of the example 4 is the same as the example 1 described with reference to FIGS. 6 and 7. The manufacturing process is the same as the example 1 described with reference to FIG. 5. The solder ball loading unit of the example 4 is substantially the same as the example 1 described with reference to FIG. 1 except the structure of the loading cylinder 24.

FIG. 13(A) is an explanatory diagram showing the connection pad region 75A of the multilayer printed wiring board 10A in FIG. 8 and the loading cylinder 24 of the example 4 in enlargement.

In the loading cylinder 24, the bottom end of the opening portion 24A (see FIG. 2(B)) is formed in a rectangular form. Consequently, by gathering the solder balls in a substantially rectangular shape, the solder balls can be loaded effectively on the connection pads 75 within the substantially rectangular connection pad region 75A. Here, the length ax of a side (length of inner wall) 24X parallel to the loading cylinder moving direction (X direction) of the opening portion is set to a (1.1 to 4) times the length x of a side 75X parallel to the loading cylinder moving direction of the connection pad region 75A. On the other hand, a length by of a side (length of inner wall) 24Y perpendicular to the loading cylinder moving direction (Y direction) of the opening portion is set to b (1.1 to 4) times a length y of a side 75Y perpendicular to the loading cylinder moving direction of the connection pad region 75A. Thus, the solder balls can be gathered on the connection pad region 75A (on ball arranging mask located on the connection pad region) of the printed wiring board. If the value is less than 1.1 times, the solder ball group (assembly of the solder balls) 78G concentrates inside too much as shown in FIG. 15(A) so that the solder balls cannot be loaded on the connection pads 75 on the outer periphery of the connection pad region 75A. If the value exceeds 4 times, no solder ball is gathered in the center of the loading cylinder 24 as shown in FIG. 15(B), so that the solder ball cannot be loaded on the connection pad 75 in the center of the connection pad region 75A. x, y when the connection pad 75 is not disposed in a rectangular shape as shown in FIG. 13(C) are so set that the connection pads on the outermost periphery are included and the rectangular area of the connection pad region 75A is minimum.

According to the example 4, (length of a side 24X parallel to the cylinder member moving direction (X direction) of the opening portion of the loading cylinder 24)/(length of a side 75X parallel to the loading cylinder moving direction of the connection pad region 75A)=a is set larger than (length of a side 24Y perpendicular to the loading cylinder moving direction of the opening portion)/(length of a side 75Y perpendicular to the loading cylinder moving direction of the connection pad region 75A=b(a>b). For the reason, the solder ball group 78G can be formed to be long in the moving direction (X direction) of the loading cylinder 24 with respect to the substantially rectangular connection pad region 75A as shown in FIG. 13(B) and when the loading cylinder 24 is moved in the X direction, the solder balls can be loaded on the connection pads 75 within the rectangular connection pad region 75A effectively.

As shown in a plan view of FIG. 8, the plurality of the loading cylinders 24 and the plurality of the suction ball removing cylinders 61 of the solder ball loading unit 20 are arranged along the Y direction corresponding to individual connection pad region 75A on the multilayer printed wiring board 10A for obtaining multiple pieces. Although a single connection pad region 75A corresponds to a single loading cylinder 24 here, the loading cylinder 24 may be formed in a size corresponding to a plurality of the connection pads 75A. The Y direction is set for convenience and they may be arranged in the X direction. The XYθ suction table 14 positions, sucks, holds and corrects the multilayer printed wiring board 10 on which the solder balls are to be loaded. The alignment camera 46 detects an alignment mark on the multilayer printed wiring board 10 on the XYθ suction table 14 and the positions of the multilayer printed wiring board 10 and the ball arranging mask 16 are adjusted based on the detected position. The remainder detecting sensor 18 detects the remainder of the solder ball according to an optical method.

Because the solder ball loading process by the solder ball loading unit 20 of the example 4 is the same as the example 1 described with reference to FIGS. 2 to 4, description thereof is omitted.

EXAMPLE 4

(1) Production of Printed Wiring Board

A double side copper clad laminate board (manufactured by, for example, Hitachi Chemical Co., Ltd. MCL-E-67) was used as a starring material and a through hole conductors and a conductor circuits were formed in this substrate according to a well known method. After that, an interlayer insulation layers and a conductor circuit layers were laid alternately according to a well known method (for example, "Built-up multilayer printed wiring board" (written by KIYOSHI TAKAGI), published by NIKANN KOGYO SHINBUN-SHA, Jun. 20, 2000) so as to form a connection pad group to be connected electrically to the IC in the conductor circuit layer on the outermost layer. As for the connection pad group, 2000 pieces of connection pads of 120 μm in diameter are formed within a connection pad region (70 mm²: 10 mm×7 mm) and most of them are disposed in the form of a grid at a pitch of 150 μm. The connection pad (solder bump is formed just above the via hole) composed of a via hole is preferred to be a filled via and the amount of its dent or the amount of protrusion (see FIG. 12) is preferred to be in a range of −5 to 5 mm with respect to the thickness of conductor of the conductor circuit 158. Because the number of contact points between the solder ball and the connection pad composed of the filled via decreases if the amount of the dent of the filled via exceeds 5 μm (−5 μm), wettability at the time when the solder bump is formed worsens so that void is wound into the solder or non-loading of the solder ball is likely to occur (missing bump). On the other hand, if the thickness exceeds 5 μm, the thickness of the conductor circuit 158 increases and this is not suitable for formation into a fine structure.

A marketed solder resist was formed thereon (in the thickness of 20 μm) and an opening 90 μm in diameter was formed in the solder resist on the connection pad according to photography method in order to expose the connection pad.

(2) Loading of Solder Balls

Marketed rosin base flux was applied to the surface (IC loading face) of a printed wiring board produced in (1). After that, this was mounted on a suction table of the solder ball loading unit of the present invention described above and alignment marks on the printed wiring board and the ball arranging mask were recognized with a CCD camera so as to match the position of the printed wiring board with that of the ball arranging mask. As a ball arranging mask, a Ni made metal mask having an opening of 110 μm in diameter at a position corresponding to the connection pad of the printed wiring board was used. The thickness of the metal mask is preferred to be ¼ to ¾. Although the Ni made metal mask is used, it is permissible to use a ball arranging mask made of SUS or polyimide. The diameter of an opening formed in the ball arranging mask is preferred to be 1.1 to 1.5 times the diameter of a ball for use. Next, a loading cylinder made of SUS having a size corresponding to the connection pad region (1.1 to 4 times an area in which the connection pad is formed) and 200 mm in height was positioned above the metal mask (ball arranging mask) with a clearance of 0.5 to 4 times the diameter of the solder ball and an Sn63Pb37 solder ball (manufactured by Hitachi Metals, Ltd.) 80 μm in diameter was loaded on the ball arranging mask around it. Although as the solder ball, Sn/Pb solder was used according to the example 4, it is permissible to use Pb free solder selected from Sn, Ag, Cu, In, Bi, Zn and the like.

By sucking air from the suction portion (5 to 20 mm in diameter) 24B (see FIG. 2(B)) at the top portion of the loading cylinder, a following equation was satisfied so that the solder balls were gathered on the ball arranging mask within the loading cylinder.

"air speed in a clearance between the loading cylinder and the ball arranging mask>air speed within the loading cylinder and speed of natural drop of the solder ball>air speed within the loading cylinder (except air speed in the suction portion)"

To satisfy the above-described relation equation, following main parameters are adjusted.

Parameter (1): amount of suction from the suction portion at the top portion of the loading cylinder (2 L/min to 500 L/min)

Parameter (2): clearance between the loading cylinder and the ball arranging mask (0.5 to 2.5 times the diameter of the solder ball)

Parameter (3): area of the opening portion 24(A) at the bottom end of the loading cylinder (see FIG. 2(B) and FIG. 9)

The air speed between the loading cylinder and the ball arranging mask can be adjusted to 5 to 35 m/sec and the air speed within the loading cylinder can be adjusted to 0.1 m/sec to 2 m/sec. Further, the size of the loading cylinder (see FIG. 13) does not need to be enlarged to the same size of the connection pad region (electronic component loading area). The magnification of the loading cylinder with respect to the connection pad region is preferred to be larger on the side in the moving direction. If the loading cylinder is enlarged in the moving direction like this, it comes that the solder balls exist widely in the moving direction as described above with reference to FIG. 13(B). Thus, a chance that a plurality of solder balls may drop into the opening portion of the ball arranging mask occurs, so that the loading percentage of the solder balls is improved.

After that, by feeding the loading cylinder at a moving speed of 20 mm/sec, the solder balls were moved and dropped through the opening portions in the ball arranging mask and loaded on the connection pad. Next, excess solder balls were removed from the ball arranging mask and the solder ball arranging mask and printed wiring board were removed from the solder ball loading unit individually. Finally, the printed wiring board produced in the previous step was charged to reflow set at 230° C. so as to prepare a solder ball provided printed wiring board.

EXAMPLE 4-1

The example 4-1 was manufactured in the same manner as the example 4 and as the solder ball of 80 μm in diameter was used. In the meantime, the number of the pads was changed from 2000 to 4000. As a result, the connection pad region turned to 130 mm² (75X=13 mm, 75Y=10 mm, see FIG. 13(A)). As regards loading of the ball, the above-described main parameter was adjusted as follows.

(1) Amount of suction=25 L/min (diameter of the suction portion: 6.5 mm in diameter)
(2) Clearance: 0.2 to 0.3 mm
(3) Opening area=1170 mm² (24X=39: a=3, 24Y=30: b=3)

As a result, the air speed between the loading cylinder and the ball arranging mask was 11 to 17 m/sec and the air speed within the loading cylinder was 0.65 m/sec or less. Because no solder ball was sucked from the suction portion, it was confirmed that the air speed within the loading cylinder was less than the speed of natural drop of the solder ball (less than the speed of natural drop of the solder ball>air speed within the loading cylinder).

EXAMPLE 4-2

According to the example 4-2, a, b were set to a=b=1.1 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-3

According to the example 4-3, a, b were set to a=b=4 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-4

According to the example 4-4, a, b were set to a=3, b=1.1 in the example 4-1. By adjusting the parameters (1) in a range of the example 4-1, the air speed between the loading cylinder and the ball arranging mask was set to 5 to 10 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-5

According to the example 4-5, a, b were set to a=4, b=1.1 in the example 4-1. By adjusting the parameters (1) in a range of the example 4-1, the air speed between the loading cylinder and the ball arranging mask was set to 20 to 25 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-6

According to the example 4-6, a, b were set to a=4, b=3 in the example 4-1. By adjusting the parameters (1) in a range of the example 4-1, the air speed between the loading cylinder and the ball arranging mask was set to 30 to 35 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-7

According to the example 4-7, a, b were set to a=2, b=1.1 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-8

According to the example 4-8, a, b were set to a=3, b=1.1 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-9

According to the example 4-9, a, b were set to a=4, b=1.1 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLE 4-10

According to the example 4-10, a, b were set to a=4, b=3 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

Reference Example 4-1

According to the reference example 4-1, a, b were set to a=b=1 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

REFERENCE EXAMPLE 4-2

According to the reference example 4-2, a, b were set to a=b=5 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

REFERENCE EXAMPLE 4-3

According to the reference example 4-3, a, b were set to a=b=3 in the example 4-1. By adjusting the parameters (1) in a range of the example 4-1, the air speed between the loading cylinder and the ball arranging mask was set to less than 5 m/sec and the air speed within the loading cylinder was set to 0.65 m/sec or less. Because no solder ball was sucked from the suction portion, it could be confirmed that speed of natural drop of the solder ball>air speed within the loading cylinder.

REFERENCE EXAMPLE 4-4

According to the reference example 4-4, a, b were set to a=b=3 in the example 4-1. By adjusting the parameters (1) in a range of the example 4-1, the air speed between the loading cylinder and the ball arranging mask was set to 40 to 45 m/sec and the air speed within the loading cylinder was set to 0.65 m/sec or less. Because no solder ball was sucked from the suction portion, it could be confirmed that speed of natural drop of the solder ball>air speed within the loading cylinder.

REFERENCE EXAMPLE 4-5

According to the reference example 4-5, a, b were set to a=1, b=1.1 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

REFERENCE EXAMPLE 4-6

According to the reference example 4-6, a, b were set to a=5, b=1.1 in the example 4-1. By adjusting the parameters (1) in a range of the example 4-1, the air speed between the loading cylinder and the ball arranging mask was set to 11 to 17 m/sec and the air speed within the loading cylinder was set to 0.65 m/sec or less. Because no solder ball was sucked from the suction portion, it could be confirmed that speed of natural drop of the solder ball>air speed within the loading cylinder.

EXAMPLES 4-11 TO 20, REFERENCE EXAMPLES 4-7 TO 12

According to the examples 4-1 to 10 and the reference examples 4-1 to 6, solder balls of 40 μm in diameter were used. Accompanied by this change, the thickness of film of the solder resist was set to 10 μm and the opening of the solder resist was set to 45 μm in diameter and the opening in the ball arranging mask was set to 50 μm in diameter. Further, the air speed within the loading cylinder was adjusted to 0.1 m/sec. The other things were based on each example 4 and each reference example 4.

EXAMPLES 4-21 TO 30, REFERENCE EXAMPLES 4-13 TO 18

According to the examples 4-1 to 10 and the reference examples 4-1 to 6, solder balls of 150 μm in diameter were used. Accompanied by this change, the connection pad was set to 200 μm in diameter, the opening in the solder resist was set to 170 μm in diameter and the opening in the ball arranging mask was set to 200 μm in diameter. Most of the connection pads were formed at a pitch of 250 μm and by decreasing the number of the connection pads, the connection pad region was formed within 130 mm$^2$. The other things were based on each example 4 and each reference example 4.

EXAMPLES 4-31 TO 40, REFERENCE EXAMPLES 4-19 TO 24

According to the examples 4-1 to 10 and the reference examples 4-1 to 6, solder balls of 180 μm in diameter were used. Accompanied by this change, the connection pad was set to 250 μm in diameter, the opening in the solder resist was set to 220 μm in diameter and the opening in the ball arranging mask was set to 250 μm in diameter. Most of the connection pads were formed at a pitch of 300 μm and by decreasing the number of the connection pads, the connection pad region was formed within 130 mm$^2$. The other things were based on each example 4 and each reference example 4.

Comparative Example 4-1

The solder ball loading method of the example 4-1 was changed and solder balls of 80 μm in diameter were loaded on a printed wiring board using a ball arranging squeegee as the conventional technology says.

Comparative Example 4-2

The solder ball loading method of the example 4-11 was changed and solder balls of 40 μm in diameter were loaded on a printed wiring board using a ball arranging squeegee as the conventional technology says.

Comparative Example 4-3

The solder ball loading method of the example 4-21 was changed and solder balls of 150 μm in diameter were loaded on a printed wiring board using a ball arranging squeegee as the conventional technology says.

Comparative Example 4-4

The solder ball loading method of the example 4-31 was changed and solder balls of 180 μm in diameter were loaded on a printed wiring board using a ball arranging squeegee as the conventional technology says.

Comparative Example 4-5

According to the comparative example 4-5, solder bumps were formed using solder paste instead of solder ball in the example 4-1.

(Evaluation Test)

100 pieces of solder ball provided printed wiring boards of each example 4, reference example 4 and comparative example 4 were produced and whether or not any solder bumps existed on all the connection pads of each printed wiring board was verified (with a microscope of 10 magnifications). Then, a printed wiring board in which the solder bumps were formed on all the connection pads was recognized as an acceptable product and a printed wiring board in which no solder bump was formed was recognized as an unacceptable product. By counting the number of the acceptable printed wiring boards, a yield was obtained (quantity of acceptable printed wiring boards/100×100%). This result is indicated in FIGS. 16 and 17.

It was made evident that the yield could be raised by setting a and b to 1.1 to 4 times. Further, it was made evident that the yield could be raised further by setting a larger than b. On the other hand, it was made evident that the solder balls could be loaded on the connection pads effectively by adjusting the air speed between the loading cylinder and the ball arranging mask to 5 to 35 m/sec.

If the yield of the comparative example 4 is compared with the yield of the present invention, it is evident that the present invention is significant when the solder ball has a diameter of 40 to 150 μm.

The height of the solder bump (height projecting from the solder resist) of the example 4-1 and the comparative example 4-5 was measured with a WYKO "NT2000" manufactured by VEECO INSTRUMENTS and its dispersion (σ) was calculated. Its result is as follows.

| Example 4-1 | 1.26 |
| Comparative example 4-5 | 2.84 |

An IC was mounted on the printed wiring boards of the example 4-1 and the comparative example 4-5 and under-fill was charged between the IC and printed wiring board so as to prepare an IC loaded printed wiring board. After that, connection resistance of a specified circuit connected to the rear surface of the IC loaded printed wiring board through the IC was measured from the rear surface (opposite side to the IC loaded face) of the IC loaded printed wiring board as an initial value. After the initial value was measured, it was left in the atmosphere of 85° C.×80% for 15 hours and then, heat cycle test was carried out for 1,000 times with −55° C.×5 minutes to 125° C.×5 minutes as a single cycle and the connection resistance was measured again to investigate the connection reliability. In the meantime, the amount of change of connection resistance is expressed by ((connection resistance after heat cycle−connection resistance as an initial value)/connection resistance as an initial value)×100. If the value is within ±10%, the product is acceptable and if it is over that value, the product is unacceptable. As for the result, the example 4-1 was acceptable and the comparative example 4-5 was unacceptable.

EXAMPLE 5

The structure of the multilayer printed wiring board manufactured using the solder ball loading method and loading unit of the example 5 of the present invention will be described. The structure of the multilayer printed wiring board 10 of the example 5 is the same as the example 1 described with reference to FIGS. 6 and 7. The solder ball loading unit of the example 5 is substantially the same as the example 1 described with reference to FIG. 1.

Figure 20:
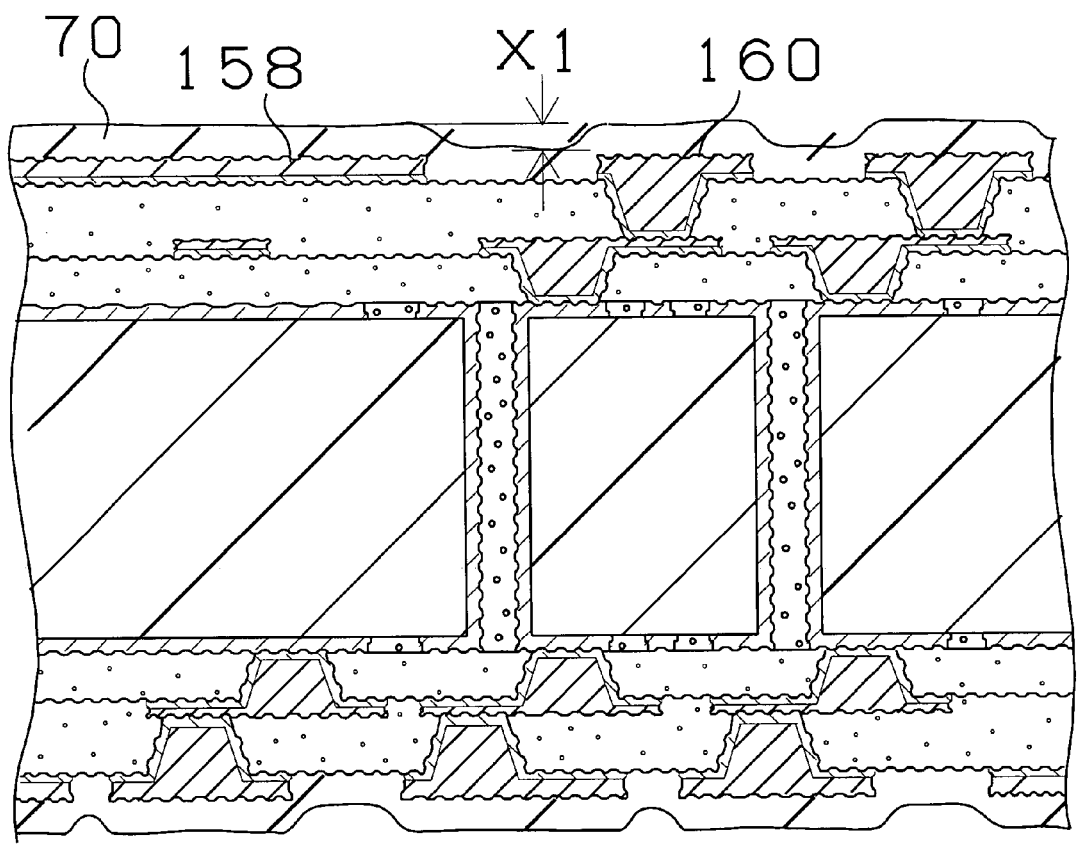
FIG. 20 is a sectional view showing a multilayer printed wiring board in FIG. 18(B) in enlargement.

The manufacturing method of the multilayer printed wiring board 10A shown in FIG. 5(A) will be described with reference to FIGS. 18 and 19. A solder resist layer 70 was provided on the surface of the multilayer printed wiring board 30 shown in FIG. 18(A) and left semi-hardened (FIG. 18(B)). This solder resist layer 70 has unevenness (difference X1) originating from the conductor circuit 158 of the multilayer printed wiring board 30 (see FIG. 20 presented by enlarging FIG. 18(B) partially). Then, a PET film 73 was pasted to both surfaces of the semi-hardened solder resist layer 70 and the surface of the solder resist layer 70 was flattened by applying pressure via the PET film 73 (FIG. 18(C)). After that, a photo film 69 in which a circle pattern 69a corresponding to an opening was drawn was placed in a fitting condition and exposed to ultraviolet ray (FIG. 19(A)). After development, it was heat treated at 80° C. for an hour, at 120° C. for an hour and at 150° C. for three hours so as to form the solder resist layer 70 having an opening (opening diameter: 100 μm) 71 corresponding to the formation position of the connection pad (FIG. 19(B)). A nickel plating film 72 and a gold plating film 74 were formed on the connection pad 75 in the opening 71 (FIG. 19(C)).

Flux 80 is printed on the surface of the multilayer printed wiring board 10A in which the connection pad 75 is formed in the opening 71 of the solder resist layer 70 as shown in FIG. 5(A) like the example 1. The fine solder balls 78s (manufactured by for example, Hitachi Metals, Ltd., TAMURA, 40 μm or more to less than 200 μm in diameter) were loaded on the connection pads 75 on the upper side of the multilayer printed wiring board 10A with the aforementioned solder ball loading unit as shown in FIG. 5(B). A solder ball of its diameter less than 200 μm is preferable for meeting formation into a fine structure. If it is less than 40 μm in diameter, the solder ball does not drop on the connection pad because the solder ball is too light. On the other hand, if the diameter is over 200 μm, the solder balls cannot be gathered within the loading cylinder because it is too heavy, so that there exist connection pads on which no solder ball loaded. According to the present invention using the solder ball of 40 μm to 200 μm in diameter is significant. This range is advantageous for formation into a fine structure. Because the method of loading the solder ball on the connection pad by sucking the solder ball with a suction head is incapable of sucking the solder ball due to its small diameter, excellence of the method of the example 5 is made evident.

After that, the solder balls 78L having an ordinary diameter (250 μm in diameter) were sucked with the suction head of the conventional technology (for example, Japanese Patent No. 1975429) and loaded on the connection pads 75 under the multilayer printed wiring board 10A as shown in FIG. 5(C). After that, by heating with a reflow furnace, solder bumps 78U were formed at a pitch of 60 μm or more to less than 200 μm on the upper side of the multilayer printed wiring board 10A, totaling for example, 2000 to 30000 pieces and a BGA78Ds were formed at a pitch of 2 mm, on the bottom side, totaling for example 250 pieces. If the pitch is less than 60 μm, it is difficult to manufacture the solder balls suitable for that pitch. Although there is no problem in manufacturing according to this method if the pitch is 200 μm or more, the manufacturing is enabled even if the conventional technology is used. Further, the multilayer printed wiring board 10A for obtaining multiple pieces was cut out to individual multilayer printed wiring boards 10 and the IC chips 90 were loaded thereon via the solder bumps 78U by reflow and after that, the multilayer printed wiring board 10 loaded with the IC chip 90 was installed on a daughter board 94 via the BGA78D.

Because the loading process of the solder balls by means of the solder ball loading unit 20 of the example 5 is the same as the example 1 described with reference to FIGS. 2 to 4, description thereof is omitted.

Because according to the example 5, even in a printed wiring board having much unevenness on its surface like a built-up multilayer wiring board, the surface of its solder resist layer semi-hardened or in dry condition is flattened by pressing with a flat member such as a PET film, the surface of the ball arranging mask on the printed wiring board is flattened so that by moving on the ball arranging mask, the solder balls can be loaded on the connection pad appropriately.

EXAMPLE 5-1

(1) Production of Printed Wiring Board

Using a double side copper clad laminate board (for example, Hitachi Chemical Co., Ltd., MCL-E-67) as a starting material, a through hole conductors and a conductor circuits were formed in this substrate according to a well known method. After that, according to a well known method (for example, "Built-up multilayer printed wiring board (written by KIYOSHI TAKAGI)" published by NIKKAN KOGYO SHINBUNSHA, Jun. 20, 2000), an interlayer insulation layers and a conductor circuit layers were laid alternately and in a conductor circuit layer on the outermost layer, a connection pad group was formed to be electrically connected to an IC. The connection pad (solder bump is formed just above the via hole) composed of a via hole mentioned here is a filled via and the amount of dent or the amount of protrusion (see FIG. 12) is preferred to be −5 to 5 μm with respect to the conductor thickness of the conductor circuit 158. If the amount of dent of the filled via exceeds 5 μm (−5 μm), the number of contact points between the solder ball and the connection pad comprising the filled via decreases, so that its wettability when it is turned to a solder bump worsens and consequently, void is wound into the solder or non-loading (missing bump) is likely to occur. On the other hand, if it exceeds 5 μm, this is not suitable for formation into a fine structure because the thickness of the conductor circuit 158 is increased. Further, flattening described later becomes difficult to execute. As for the connection pad group, 2000 pieces of the connection pads of 120 μm in diameter, whose conductor thickness was 15 μm to 20 μm were formed in a connection pad region (70 mm$^2$: 10 mm×7 mm) and most of them are disposed in the form of a grid at a pitch of 150 μm.

A marketed solder resistor ink was formed on a surface in which the connection pad is formed according to a screen printing method under following print condition.
Solder resist ink: RPZ-1 (Hitachi Chemical Co., Ltd.)
Screen plate: made of polyester fiber
Squeegee speed: 100 to 200 mm/second After that, it was dried at 50° C. for 10 minutes and the solder resist ink was printed on another surface under the same condition and dried at 60 to 70° C. for 20-25 minutes so as to form a semi-hardened solder resist layer. After that, unevenness of part of the connection pad region was measured with a surface roughness meter (for example, "SURFCOM480A" manufactured by Tokyo Seimitsu Co., Ltd., WYKO "NT2000" manufactured by VEECO INSTRUMENTS (quantity of measurements is 5).

Unevenness measuring portion and amount of unevenness: an interface between the height of the surface of the solder resist layer on the connection pad and the height of the surface of the solder resist layer of an adjacent non-connection pad portion (portion having no conductor circuit) was measured (see FIG. 18(B) and FIG. 20 showing a measured portion of FIG. 18(B) in enlargement) and a difference of the height is regarded as the amount of unevenness (X in the same FIG. 1). Minimum value (min) and maximum value (max) of a measured value are indicated in the same Figure.

Next, the PET film was pasted on both sides of the solder resist layer and the surface of the solder resist was flattened by applying pressure to the solder resist layer via the PET film. As the condition at that time, it is preferable that the press temperature is 30 to 100° C., the press pressure was 1.0 to 10 MPa and press time is 20 seconds to 5 minutes. If the temperature is less than 30° C., the flattening is difficult because the solder resist is hard. On the other hand, if it exceeds 100° C., it softens too much and if it is pressed, the thickness of the solder resist decreases too much. If the press pressure is less than 1.0 MPa, the flattening is difficult and if it exceeds 10 MPa, it is difficult to attain both maintenance of the thickness of the solder resist and flattening. If the press time is less than 20 seconds, the flattening is difficult and if it exceeds five minutes, the thickness of the solder resist decreases. The example 5 was carried out in a condition in which the press temperature was 80° C., press pressure was 5 MPa and press time was two minutes. FIG. 18(C) shows the shape of the solder resist surface after that. The number of measuring points of the amount of unevenness is the same as FIG. 18(B). A photo mask film (not shown) 5 mm thick in which a circular pattern (mask pattern) was drawn was loaded on a flattened surface of the solder resist layer in a fitting condition and exposed to ultraviolet ray of 1000 mj/cm$^2$ and then developed with sodium carbonate. By heat treating at 80° C. for an hour, at 120° C. for an hour and at 150° C. for three hours, a hardened solder resist layer having an opening (opening diameter: 100 μm) corresponding to the formation position of the connection pad was formed.

(2) Loading of Solder Balls

Marketed rosin base flux was applied to the surface (IC loading face) of a printed wiring board produced in (1). After that, this was mounted on a suction table of the solder ball loading unit of the present invention described above and an alignment marks on the printed wiring board and the ball arranging mask were recognized with a CCD camera so as to match the position of the printed wiring board with that of the ball arranging mask. As a ball arranging mask, a Ni made metal mask having an opening of 110 μm in diameter at a position corresponding to the connection pad of the printed wiring board was used. The thickness of the metal mask is preferred to be ¼ to ¾ of the solder ball. Although the Ni made metal mask is used, it is permissible to use a ball arranging mask made of SUS or polyimide. The diameter of an opening formed in the ball arranging mask is preferred to be 1.1 to 1.5 times the diameter of a ball for use. Next, a loading cylinder made of SUS having a size corresponding to the connection pad region (1.1 to 4 times an area in which the connection pad is formed) and 200 mm in height was positioned above the metal mask (ball arranging mask) with a clearance of 0.5 to 4 times the diameter of the solder ball and an Sn63Pb37 solder ball (manufactured by Hitachi Metals, Ltd.) of 80 μm in diameter was loaded on the ball arranging mask around it. Although as the solder ball, Sn/Pb solder was used according to the example 5-1, it is permissible to use Pb free solder selected from Sn, Ag, Cu, In, Bi, Zn and the like.

By sucking air from the suction portion (5 to 20 mm in diameter) 24B (see FIG. 2(B)) at the top portion of the loading cylinder, the solder balls were gathered on the ball arranging mask within the loading cylinder.

After that, the loading cylinder was fed at a moving speed of 20 mm/sec so as to move the solder balls and dropped through the opening portions in the ball arranging mask and loaded on the connection pads. According to the example 5-1, the loading cylinder 24 is constituted of conductive metal such as SUS stainless, Ni, Cu and grounded to the side of the solder ball loading unit 20. Next, excess solder balls were removed from the ball arranging mask and the solder ball arranging mask and printed wiring board were removed from the solder ball loading unit individually. Finally, the printed wiring board produced in the previous step was applied to reflow set at 230° so as to prepare a solder ball provided printed wiring board.

After the solder bumps were formed, an IC chip was mounted via the solder bumps and a marketed under-fill was charged and hardened between the IC chip and a solder resist so as to prepare an IC loaded printed wiring board.

EXAMPLE 5-2

According to the example 5-2, the number of the connection pads was changed from 2,000 to 4,000 in the example 5-1 and the area of the electronic component loading area (connection pad region) was changed from 70 mm² to 130 mm².

EXAMPLE 5-3

According to the example 5-3, the number of the connection pads was changed from 2,000 to 10,000 in the example 5-1 and the area of the electronic component loading area was changed from 70 mm² to 310 mm².

EXAMPLE 5-4

According to the example 5-4, the number of the connection pads was changed from 2,000 to 30,000 in the example 5-1 and the area of the electronic component loading area was changed from 70 mm² to 1200 mm².

EXAMPLES 5-5 TO 8

According to the examples 5-5 to 8, the flattening condition of the solder resist in the examples 5-1 to 4 was changed to 5 Mpa in pressure, two minutes in time and 60° C. in temperature.

EXAMPLES 5-9 TO 12

According to the examples 5-9 to 12, the flattening condition of the solder resist in the example 5-1 to 4 was changed to 3 Mpa in pressure, two minutes in time and 80° C. in temperature.

EXAMPLES 5-13 TO 16

According to the examples 5-13 to 16, the flattening condition of the solder resist in the examples 5-1 to 4 was changed to 1 Mpa in pressure, two minutes in time and 80° C. in temperature.

EXAMPLE 5-17

According to the example 5-17, the thickness of the solder resist was set to 25 μm and a solder ball of 80 μm in diameter was used although it was the same as the example 5-1. Then, the solder balls were moved directly on the printed wiring board without using any ball arranging mask. That is, flux 80 was charged in the opening 71 of the printed wiring board shown in FIG. 21(A) and as shown in FIG. 21(B), the loading cylinder 24 was moved on the printed wiring board 10A so as to load the solder balls 78s in the opening 71.

Comparative Examples 5-1 to 4

According to the comparative examples 5-1 to 4, the flattening of the solder resist in the example 5-1 to 4 was not carried out.

Comparative Example 5-5

According to the comparative example 5-5, the solder bumps were formed using solder paste instead of the solder balls in the example 5-1.

(Evaluation Test)
1. Observation of Abnormal Bumps

After the solder bumps were formed, the size of the solder bumps were observed about all the solder bumps with a microscope of 10 magnifications. As a result, presence or absence of abnormal bumps composed of two or more solder balls was observed. Even if there existed an abnormal bump in the all solder bumps, its result was evaluated to be unacceptable. In case where all the bumps are solder bumps each composed of a single solder ball, the result was evaluated to be acceptable.

2: HAST Test

IC loaded printed wiring boards manufactured according to the examples 5-1 to 17 and the comparative examples 5-1 to 4 were applied to HAST test (high temperature/high humidity/bias test: 85° C.×85%/3.3 V) with a voltage applied between independent bumps. After 50 hours, 100 hours, and 150 hours, insulation resistance between bumps supplied with voltage was measured. If its measurement result is $10^7 \Omega$ or more, the result is evaluated to be acceptable (◯) and if it is less than the value, the result is evaluated to be unacceptable (X). Although if the HAST test for 50 hours is passed, the product has a capacity required for practical use, it is further preferred to endure for 100 hours.

3: Heat Cycle Test

Heat cycle test was carried out with −55° C.×5 minutes to 125° C.×5 minutes as a single cycle on the IC loaded printed wiring board manufactured according to the examples 5-1 to 17 and comparative examples 5-1 to 4 for 500 times, 1000 times and 1500 times so as to measure the amount of change of connection resistance of a specified circuit connected to the rear surface of the IC loaded printed wiring board through the IC from the rear surface (opposite side to the IC loading surface) to investigate the connection reliability. In the meantime, the amount of change of the connection resistance is expressed by ((connection resistance after heat cycle−connection resistance as an initial value)/connection resistance as an initial value)×100 and if the value was within ±10%, the product was evaluated to be acceptable (◯) and otherwise, it was evaluated to be unacceptable (X). Although it is indicated that performance required for practical use is provided if the product bears heat cycle tests of 500 times, it is more preferred that it can bear for 1000 times.

From the evaluation test, it is evident that occurrence of abnormal bumps can be prevented by flattening the printed wiring board. Further, it was made evident that results of the HAST test and heat cycle test could be improved. The aforementioned amount of unevenness is preferred to be 0.3 to 6.5 μm, more preferred to be 0.8 to 5 μm and particularly more preferred to be 0.8 to 3 μm. By combining the amounts of unevenness in the range of the aforementioned press pressure, press temperature and press time, it can be achieved even in other combination than the example 5. Although there exists no problem about loading of the solder balls if it is less than 0.3 µm, it is estimated that adhesion force of under-fill charged between the IC and the solder resist drops so that the connection reliability and insulation reliability drop. On the other hand, if it exceeds 7.0 µm, the ball arranging mask does not follow the surface of the solder resist so that dispersion of distance from the surface of the connection pad to the surface (side far from the connection pad surface) of the opening portion of the ball arranging mask and consequently, two or more solder balls are loaded on a connection pad having a large distance. Therefore, it is estimated that abnormal bump occurs and insulation resistance between the connection pads drops. Further, if a high solder bump and a low solder bump coexist, stress originating from a difference of thermal expansion coefficient between the IC and printed wiring board concentrates on the low bump, so that the connection reliability drops.

As for the flattening method of the solder resist, preferably (1) after a solder resist compound is applied, the surface of the solder resist is smoothed with a squeegee, blade, roll coater, spatula or the like before it dries or hardens (including semi-hardening condition) or (2) after the solder resist compound is applied or pasted, it is left to dry or harden (including semi-hardening) and after that, the surface of the solder resist layer is pressed, ground or polished.

Particularly, it is preferable that in the above-mentioned (2), after drying or hardening (semi-hardening), for example, a resin film such as PET is pasted and the flattening is carried out by pressing the resin film. A preferable press condition is that press temperature is 30 to 100° C., press pressure is 1.0 to 10 MPa and time is 20 seconds to 3 minutes. Because dispersion of gap between the IC and solder resist decreases by flattening, the charging performance of the under-fill is improved so that voids in the under-fill decrease.

As the solder resist, a marketed product can be used and for example, RPZ-1 manufactured by Hitachi Chemical Co., Ltd., DPR-805GT7 manufactured by Asahi Chemical Research Laboratory Co., Ltd. and PSR-4000 series manufactured by Taiyo Ink Manufacturing Co., Ltd. are available.

The heights (height projecting from the solder resist) of 500 pieces of the solder bumps of the example 5-1 and the comparative example 5-5 were measured in with WYKO "NT2000" manufactured by VEECO INSTRUMENTS and its dispersion (σ) was calculated. Its result was as follows.

| Example 5-1 | 1.26 |
|---|---|
| Comparative example 5-5 | 2.84 |

An IC was mounted on a printed wiring board of the example 5-1 and the comparative example 5-5 and under-fill was applied between the IC and the printed wiring board so as to prepare an IC loaded printed wiring board. After that, connection resistance of a specified circuit connected to the rear surface of the IC loaded printed wiring board via the IC was measured from the rear surface (opposite side to the IC loaded face) of the IC loaded printed wiring board as an initial value. After the initial value was measured, it was left in the atmosphere of 85° C.×80% for 15 hours, heat cycle test was carried out for 1,000 times continuously with −55° C.×5 minutes to 125° C.×5 minutes as a single cycle so as to measure connection resistance again to investigate the connection reliability. In the meantime, the amount of change in connection resistance is expressed by (connection resistance after heat cycle−connection resistance as an initial value)/ connection resistance as an initial value)×100. If its value is within ±10%, the product is evaluated to be acceptable and if it exceeds, the product is evaluated to be unacceptable. As for the result, the example 5-1 was acceptable and the comparative example 5-5 was unacceptable.

The invention claimed is:

1. A method for forming solder bumps on connection pads of a printed wiring board, the method comprising:

providing a solder ball loading unit comprising a loading device having a suction portion and an opening portion, the loading device being configured to move over a surface of a ball arranging mask having openings corresponding to connection pads of a printed wiring board, the suction portion and opening portion of the loading device being configured to gather solder balls into a group inside the opening portion with negative pressure provided by the suction portion on a portion of the surface of the ball arranging mask surrounded by the opening portion;

positioning the loading device over a portion of the ball arranging mask;

sucking air from the suction portion such that the solder balls are gathered into the group inside the opening portion with negative pressure on the surface of the ball arranging mask; and moving the loading device horizontally with respect to the surface of the ball arranging mask such that the group of solder balls gathered inside the opening portion on the surface of the ball arranging mask is moved on the surface of the ball arranging mask and a solder ball in the group drops through one of the openings of the ball arranging mask onto a respective one of the connection pads of the printed wiring board.

2. A method for forming solder bumps on connection pads of a printed wiring board, the method comprising;

providing a solder ball loading unit comprising a loading device having a cylinder member, the loading device being configured to move over a surface of a ball arranging mask having openings corresponding to connection pads of a printed wiring board, the cylinder member having a suction portion and an opening portion, the suction portion and opening portion of the loading device being configured to gather solder balls into a group inside the opening portion with the negative pressure provided by the suction portion on a portion of the surface of the ball arranging mask surrounded by the opening portion, the opening portion having a bottom end portion which makes clearance relative to the ball arranging mask different for a back and forth direction and a right and left direction with respect to a moving direction of the loading device;

sucking air inside the cylinder member from the suction portion such that the solder balls are gathered into the group inside the opening portion with negative pressure on the surface of the ball arranging mask; and moving the cylinder member horizontally with respect to the surface of the ball arranging mask such that a solder ball in the group of solder balls is dropped onto one of the connection pads of the printed wiring board through a respective one of the openings in the ball arranging mask.

3. A method for forming solder bumps on connection pads of a printed wiring board, the method comprising:

providing a solder ball loading unit comprising a loading device having a cylinder member, the loading device being configured to move over a surface of a ball arranging mask having openings corresponding to connection pads of a printed wiring board, the cylinder member comprising a conductive material and having a suction portion and an opening portion, the suction portion and opening portion of the cylinder member being configured to gather solder balls into a group inside the opening portion with negative pressure provided by the suction portion on a portion of the surface of the ball arranging mask surrounded by the opening portion;

positioning the loading device over a portion of the ball arranging mask;

sucking air inside the cylinder member from the suction portion such that the solder balls are gathered into the group inside the opening portion with negative pressure on the surface of the ball arranging mask; and moving the cylinder member horizontally with respect to the ball arranging mask such that a solder ball in the group of solder balls drops onto one of the connection pads of the printed wiring board through a respective one of the openings in the ball arranging mask.

4. A method for forming solder bumps on connection pads in a connection pad region of a printed wiring board, the method comprising:

providing a solder ball loading unit comprising a loading device having a cylinder member, the loading device being configured to move over a surface of a ball arranging mask having openings corresponding to connection pads of a printed wiring board, the cylinder member having a suction portion and a rectangular opening portion, the suction portion and rectangular opening portion of the cylinder member being configured to gather solder balls into a group inside the opening portion with negative pressure provided by the suction portion on a portion of the surface of the ball arranging mask surrounded by the rectangular opening portion;

positioning the loading device over a portion of the ball arranging mask; sucking air inside the cylinder member from the suction portion such that the solder balls are gathered into the group inside the opening portion with negative pressure on the surface of the ball arranging mask; and moving the cylinder member horizontally with respect to the ball arranging mask such that the group of solder balls gathered inside the opening portion on the surface of the ball arranging mask is moved on the surface of the ball arranging mask and a solder ball in the group drops onto one of the connection pads of the printed wiring board through a respective one of the openings in the ball arranging mask, wherein the rectangular opening portion has a plurality of first side portions parallel to a moving direction of the cylinder member and a plurality of second side portions perpendicular to the moving direction of the cylinder member, the connection pad region has a plurality of first side portions parallel to the moving direction of the cylinder member and a plurality of second side portions perpendicular to the moving direction of the cylinder member, the plurality of first side portions of the rectangular opening portion has a length set to 1.1 to 4 times a length of the plurality of first side portions of the connection pad region, and the plurality of second side portions of the rectangular opening portion has a length set to 1.1 to 4 times a length of the plurality of second side portions of the connection pad region.

5. A method for forming solder bumps on electrodes of a printed wiring board, the method comprising:

providing a solder ball loading unit comprising a loading device having a cylinder member, the loading device being configured to move over a surface of a ball arranging mask having openings corresponding to electrodes exposed from openings in a solder resist layer of a printed wiring board, the cylinder member having a suction portion and an opening portion, the suction portion and opening portion of the cylinder member being configured to gather solder balls into a group inside the opening portion with negative pressure provided by the suction portion on a portion of the surface of the ball arranging mask surrounded by the opening portion;

positioning the loading device over a portion of the ball arranging mask;

sucking air inside the cylinder member from the suction portion such that the solder balls are gathered into the group inside the opening portion with negative pressure on the surface of the ball arranging mask; and moving the cylinder member horizontally with respect to the ball arranging mask such that the group of solder balls gathered inside the opening portion on the ball arranging mask is moved on the surface of the ball arranging mask and a solder ball in the group drops through one of the openings in the ball arranging mask.

6. A method for forming solder bumps on electrodes exposed from openings in a solder resist layer of a printed wiring board, the method comprising:

providing a solder ball loading unit comprising a loading device having a cylinder member, the loading device being configured to move over a surface of a solder resist layer of a printed wiring board, the cylinder member having a suction portion and an opening portion, the suction portion and opening portion of the cylinder member being configured to gather solder balls into a group inside the opening portion with negative pressure provided by the suction portion on a portion of the surface of the solder resist layer surrounded by the opening portion;

positioning the loading device over a portion of the solder resist layer;

sucking air inside the cylinder member from the suction portion such that the solder balls are gathered into the group inside the opening portion with negative pressure on the surface of the solder resist layer; and moving the cylinder member horizontally with respect to the solder resist layer such that the group of solder balls gathered inside the opening portion on the solder resist layer is moved on the surface of the solder resist layer and a solder ball in the group is loaded onto one of the electrodes exposed from a respective one of openings in the solder resist layer of the printed wiring board.

7. The method according to claim 5, further comprising flattening the surface of the solder resist layer, wherein the flattening of the surface of the solder resist layer is carried out by pressing the solder resist layer with a flattening member when the solder resist layer is semi-hardened or dried.

8. The method according to claim 5, further comprising flattening the surface of the solder resist layer.

9. The method according to claim 6, further comprising flattening the surface of the solder resist layer.

* * * * *

UNITED STATES PATENT AND TRADEMARK OFFICE
CERTIFICATE OF CORRECTION

PATENT NO. : 7,475,803 B2 Page 1 of 1
APPLICATION NO. : 11/371083
DATED : January 13, 2009
INVENTOR(S) : Sumita et al.

It is certified that error appears in the above-identified patent and that said Letters Patent is hereby corrected as shown below:

On the title page, item (54) and Column (1) should read:

--(54)  SOLDER BALL LOADING METHOD AND SOLDER BALL LOADING UNIT--

Signed and Sealed this

Seventeenth Day of March, 2009

JOHN DOLL
*Acting Director of the United States Patent and Trademark Office*